(12) United States Patent
Motomura et al.

(10) Patent No.: US 7,746,912 B2
(45) Date of Patent: Jun. 29, 2010

(54) SURFACE EMITTING LASER ELEMENT, SURFACE EMITTING LASER ARRAY, OPTICAL SCANNING APPARATUS, IMAGE FORMING APPARATUS, AND OPTICAL COMMUNICATION SYSTEM

(75) Inventors: Hiroshi Motomura, Miyagi (JP); Naoto Jikutani, Miyagi (JP); Shunichi Sato, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 11/895,832

(22) Filed: Aug. 27, 2007

(65) Prior Publication Data

US 2008/0056321 A1 Mar. 6, 2008

(30) Foreign Application Priority Data

Aug. 31, 2006 (JP) .............................. 2006-235507

(51) Int. Cl.
*H01S 5/00* (2006.01)
(52) U.S. Cl. .............. 372/50.124; 372/50.1; 372/45.01; 372/34
(58) Field of Classification Search ............ 372/50.124, 372/50.1, 45.01, 34
See application file for complete search history.

(56) References Cited

U.S. PATENT DOCUMENTS

| | | | | |
|---|---|---|---|---|
| 5,799,030 | A * | 8/1998 | Brenner .................... | 372/50.21 |
| 6,674,785 | B2 | 1/2004 | Sato et al. | |
| 6,697,405 | B2 * | 2/2004 | Kitatani et al. .......... | 372/45.01 |
| 6,765,232 | B2 | 7/2004 | Takahashi et al. | |
| 6,803,604 | B2 | 10/2004 | Takahashi et al. | |
| 6,927,412 | B2 | 8/2005 | Takahashi et al. | |
| 6,959,025 | B2 | 10/2005 | Jikutani et al. | |
| 2004/0031915 | A1 * | 2/2004 | Ito et al. .................... | 250/234 |
| 2005/0147143 | A1 | 7/2005 | Jikutani | |
| 2005/0169334 | A1 | 8/2005 | Sato | |
| 2005/0230674 | A1 | 10/2005 | Takahashi et al. | |
| 2005/0238075 | A1 | 10/2005 | Jikutani et al. | |
| 2005/0271113 | A1 * | 12/2005 | Song et al. .................... | 372/98 |
| 2006/0007979 | A1 | 1/2006 | Jikutani et al. | |
| 2006/0054899 | A1 | 3/2006 | Takahashi et al. | |
| 2006/0093006 | A1 | 5/2006 | Jikutani | |
| 2006/0093010 | A1 | 5/2006 | Sekiya et al. | |
| 2006/0209373 | A1 * | 9/2006 | Kato .......................... | 359/204 |
| 2006/0261352 | A1 | 11/2006 | Takahashi | |
| 2007/0171949 | A1 | 7/2007 | Jikutani | |

FOREIGN PATENT DOCUMENTS

| | | |
|---|---|---|
| JP | 2002-164621 | 6/2002 |
| JP | 2005-86054 | 3/2005 |
| JP | 2005-354061 | 12/2005 |

OTHER PUBLICATIONS

Daniel Francis et al. "Monolithic 2D-VCSEL Array with > 2 W CW Output Power", pp. 99-100.
U.S. Appl. No. 11/647,270, filed Dec. 29, 2006.

* cited by examiner

*Primary Examiner*—Minsun Harvey
*Assistant Examiner*—Kinam Park
(74) *Attorney, Agent, or Firm*—Cooper & Dunham LLP

(57) ABSTRACT

A vertical cavity surface emitting laser element is provided that includes a substrate, a first semiconductor multilayer reflector including plural pairs of layers having differing refractive indexes and thermal resistances, a resonator region including an active layer, and a second semiconductor multilayer reflector including plural pairs of layers having differing refractive indexes and thermal resistances.

9 Claims, 21 Drawing Sheets

FIG.5

| LOWER DBR LAYER CONFIGURATION | | THERMAL RESISTANCE [K/W] | REMARKS |
|---|---|---|---|
| HIGHER REFRACTIVE INDEX LAYER: λ/8 <br> LOWER REFRACTIVE INDEX LAYER: 7λ/8 } 3 PAIRS + HIGHER REFRACTIVE INDEX LAYER: λ/4 <br> LOWER REFRACTIVE INDEX LAYER: λ/4 } 37.5 PAIRS | | 2483 | FIRST EMBODIMENT |
| HIGHER REFRACTIVE INDEX LAYER: λ/4 <br> LOWER REFRACTIVE INDEX LAYER: λ/4 } 40.5 PAIRS | | 2974 | PRIOR ART 1 |
| HIGHER REFRACTIVE INDEX LAYER: λ/4 <br> LOWER REFRACTIVE INDEX LAYER: 3λ/4 } 3 PAIRS + HIGHER REFRACTIVE INDEX LAYER: λ/4 <br> LOWER REFRACTIVE INDEX LAYER: λ/4 } 37.5 PAIRS | | 2627 | PRIOR ART 2 |

SURFACE EMITTING LASER ELEMENT, SURFACE EMITTING LASER ARRAY, OPTICAL SCANNING APPARATUS, IMAGE FORMING APPARATUS, AND OPTICAL COMMUNICATION SYSTEM

BACKGROUND

1. Technical Field

This disclosure relates to a surface emitting laser element that emits light in a vertical direction with respect to a substrate, a surface emitting laser array including such surface emitting laser elements, and an optical scanning apparatus, an image forming apparatus, and am optical communication system that use light emitted from such surface emitting laser element or surface emitting laser array.

2. Description of the Related Art

A vertical cavity surface emitting laser (VCSEL) is a semiconductor laser that emits light in a vertical direction with respect to a substrate. Since the VCSEL does not require a cleavage process, may be integrated into a two-dimensional parallel arrangement, and may be easily inspected, it is suitably used in various consumer appliances such as the light source of an image forming apparatus, the light source of an optical pickup device, the optical communication light source of an optical interconnection, for example.

The VCSEL used in such appliances desirably has an active layer with a large gain, a low threshold value, high optical power, reliability, and adequately controlled polarization. However, since the volume of the active layer of the VCSEL is relatively small, the optical power of the VCSEL may be relatively low compared to an edge emitting semiconductor laser.

Generally, the optical power, optical spectrum, mode, and service life of a semiconductor laser are affected by the degree of thermal diffusion resulting from current injection. It is particularly noted that since the VCSEL has its active layer arranged between semiconductor multilayer reflector (DBR: Distributed Bragg Reflector) mirrors that have high thermal resistance, significant temperature increase may occur in the active layer.

Accordingly, techniques have been proposed for controlling such temperature increase in the active layer of the VCSEL. For example, Japanese Laid-Open Patent Publication No. 2002-164621 discloses a surface emitting semiconductor laser element having a bottom DBR made of AlGaAs material, wherein AlAs, which has the lowest thermal resistance among AlGaAs materials, is used as a lower refractive index layer making up a large portion of the lower side of the bottom DBR.

Japanese Laid-Open Patent Publication No. 2005-354061 discloses a VCSEL that includes a high thermal conductivity layer arranged between an active area and a DBR or within the DBR. The disclosed VCSEL may use AlAs as the high thermal conductivity layer material and further arranges the high thermal conductivity layer to have adequate thickness.

SUMMARY

There is provided in an aspect of this disclosure a surface emitting element with improved heat dissipation properties.

In another aspect of this disclosure, there is provided a surface emitting laser array having surface emitting laser elements with high optical power arranged at a high density.

In another aspect of this disclosure, there is provided an optical scanning apparatus that is capable of scanning a scanning surface at high speed.

In another aspect of this disclosure, there is provided an image forming apparatus that is capable of forming a fine image at high speed.

In another aspect of this disclosure, there is provided an optical communication system that is capable of establishing optical communication at high speed.

According to an embodiment of this disclosure, a vertical cavity surface emitting laser element is provided that includes a substrate, a first semiconductor multilayer reflector including plural pairs of layers having differing refractive indexes and thermal resistances, a resonator region including an active layer, and a second semiconductor multilayer reflector including plural pairs of layers having differing refractive indexes and thermal resistances. At least one pair of layers of the first semiconductor multilayer reflector and/or the second semiconductor multilayer reflector includes a first layer with a lower thermal resistance that has an optical thickness greater than ¼ of the oscillation wavelength and a second layer with a higher thermal resistance that has an optical thickness less than ¼ of the oscillation wavelength. The sum of the optical thickness of the first layer and the optical thickness of the second layer is equal to m/4 times the oscillation wavelength (in: even number $\geq 2$).

According to another embodiment of this disclosure, a surface emitting laser array is provided that includes a plurality of the above-mentioned vertical surface emitting laser elements.

According to another embodiment of this disclosure, a first optical scanning unit that scans a scanning surface with an optical beam is provided, the first optical scanning unit including a light source unit having the above-mentioned surface emitting laser element, a deflection unit that deflects the optical beam from the light source unit, and a scanning optical system that condenses the deflected light on the scanning surface.

According to another embodiment of this disclosure, a second optical scanning unit that scans a scanning surface with an optical beam is provided, the second optical scanning unit including a light source unit having the above-mentioned surface emitting laser array, a deflection unit that deflects the optical beam from the light source unit, and a scanning optical system that condenses the deflected light on the scanning surface.

According to another embodiment of this disclosure, a first image forming apparatus is provided that includes at least one image carrier, at least one of the first optical scanning unit, and a transfer unit that transfers an image onto a transfer medium formed on the image carrier.

According to another embodiment of this disclosure, a second image forming apparatus is provided that includes at least one image carrier, at least one of the second optical scanning unit, and a transfer unit that transfers an image onto a transfer medium formed on the image carrier.

According to another embodiment of this disclosure, a first optical communication system that conveys information using an optical signal is provided in which the optical signal is generated by an optical beam irradiated from the above-mentioned surface emitting laser element.

According to another embodiment of this disclosure, a second optical communication system that conveys in formation using an optical signal is provided in which the optical

BRIEF DESCRIPTION OF THE DRAWINGS

FIG. 5 is a table indicating the thermal resistances of lower Distributed Bragg Reflectors of the surface emitting laser element of FIG. 1 and surface emitting laser elements according to prior art examples;

DESCRIPTION OF THE PREFERRED EMBODIMENTS

In the following, preferred embodiments of the present invention are described with reference to the accompanying drawings.

First Embodiment

Figure 1:
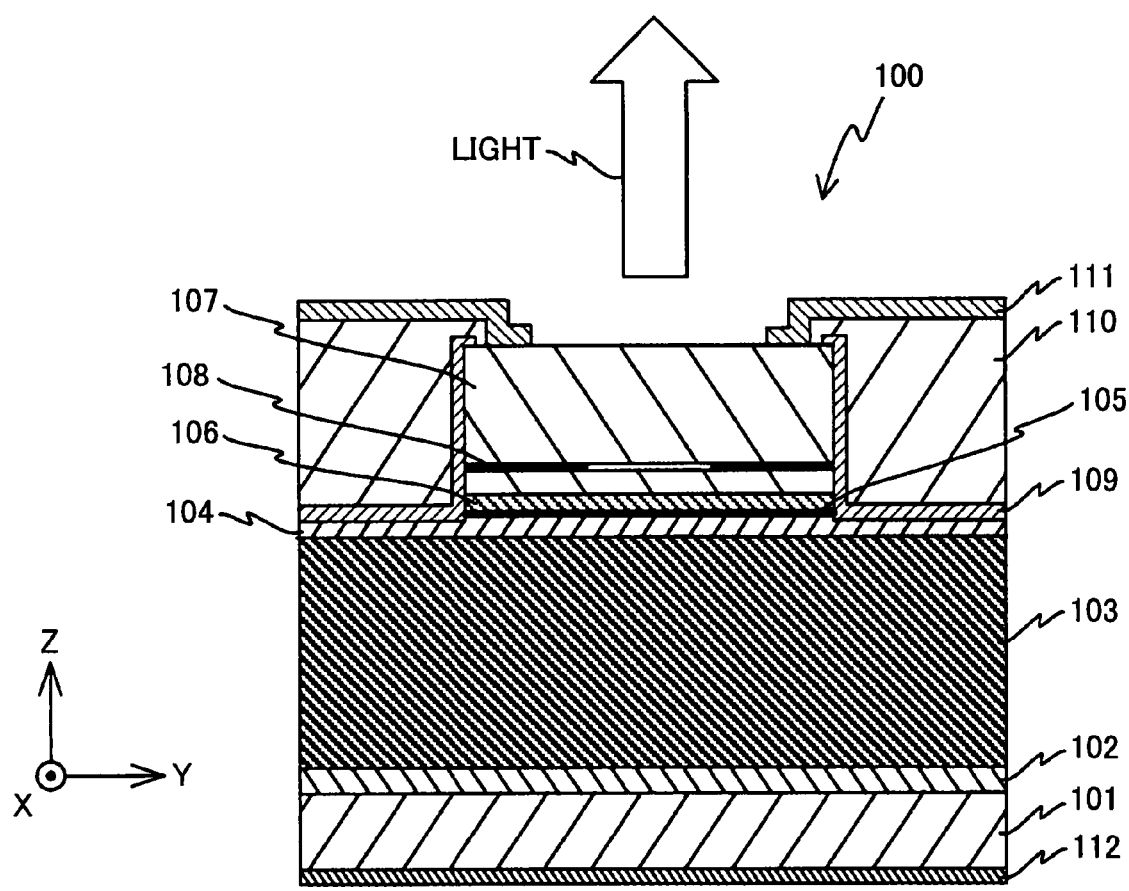
FIG. 1 is a diagram showing a configuration of a surface emitting laser element according to a first embodiment of the present invention.

A first embodiment of the present invention is described below with reference to FIGS. 1-5. FIG. 1 is a diagram illustrating an overall configuration of a vertical cavity surface emitting laser element 100 according to the first embodiment. It is noted that in the following descriptions, a laser oscillating direction is referred to as Z axis direction, and two orthogonal directions that form a plane that is perpendicular to the Z axis direction are referred to as X axis direction and Y axis direction.

The illustrated surface emitting laser element 100 is a 780-nm-band surface emitting laser element that has a substrate 101 and semiconductor layers including a buffer layer 102, a semiconductor multilayer reflector (referred to as 'lower DBR' hereinafter) 103, a lower spacer layer 104, a multi-quantum well active layer 105, an upper spacer layer 106, and an upper DBR 107, for example, that are successively layered on the substrate 101 in this order. It is noted that in the following descriptions, the above multilayer structure of the semiconductor layers is referred to as 'first multilayer structure' hereinafter.

In the present example, the substrate 101 is made of n-GaAs.

The buffer layer 102 is made of n-GaAs.

Figure 2:
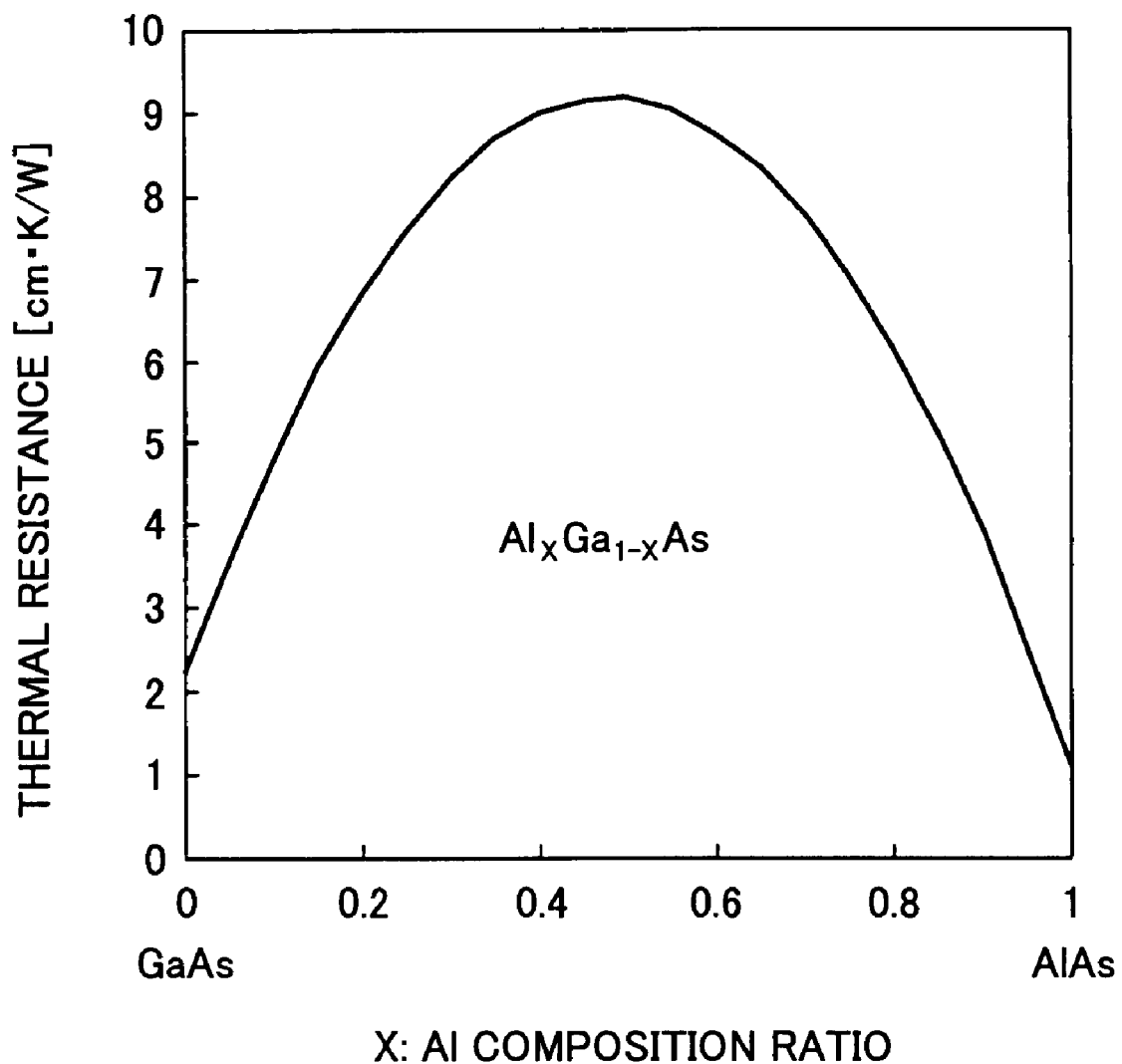
FIG. 2 is a graph showing the relationship between the mixed crystal ratio and the thermal resistance of AlGaAs mixed crystal.

The lower DBR 103 includes 44.5 pairs of refractive index layers each including a lower refractive index layer made of n-AlAs and a higher refractive index layer made of n-$Al_{0.3}Ga_{0.7}As$. In other words, the lower refractive layers and the higher refractive layers are alternatingly layered to form the lower DBR 103. Also, as is shown in FIG. 2, the thermal resistance of AlAs is 1.1 cm K/W, which is lower than the thermal resistance of $Al_{0.3}Ga_{0.7}As$, which is 8.2 cm K/W. Therefore, the thermal resistance of the lower refractive layer is lower than the thermal resistance of the higher refractive index layer. That is, according to the first embodiment of the present invention, the lower refractive layer has the lower thermal resistance and the higher refractive index layer has the higher thermal resistance.

The lower spacer layer 104 is made of non-doped $(Al_{0.1}Ga_{0.9})_{0.5}In_{0.5}P$.

The multi-quantum well active layer 105 is made of GaInPAs/GaAs.

The upper spacer layer 106 is made of non-doped $(Al_{0.1}Ga_{0.9})_{0.5}In_{0.5}P$.

The upper DBR 107 includes 26 pairs of refractive index layers each including a lower refractive index layer made of p-$Al_{0.9}Ga_{0.1}As$ and a higher refractive index layer made of p-$Al_{0.3}Ga_{0.7}As$. That is, the lower refractive index layers and the higher refractive index layers are alternatingly layered to form the upper DBR 107. It is noted that a composition gradient layer with a thickness of 20 nm in which the layer composition gradually changes from one layer composition to the other layer composition is provided between the lower refractive index layer and the higher refractive index layer in order to reduce electrical resistance. Also, it is noted that the thicknesses of the lower refractive index layer and the higher refractive index layer are arranged to satisfy their corresponding Bragg reflection conditions. Specifically, provided that the oscillation wavelength is denoted by λ and the refractive index of the refractive index layers is denoted by n, the thickness is arranged to be λ/4n (corresponding to an optical thickness of λ/4). When the thickness is set to λ/4n, an oscillation light phase change of π/2 may be achieved within the corresponding refractive index layer. In a case where a composition gradient layer is provided as in the present embodiment, the combined thickness of the lower refractive index layer and a portion (e.g., ½) of the composition gradient layer and the combined thickness of the higher refractive index layer and the remaining portion of the composition gradient layer are arranged to satisfy their corresponding Bragg reflection conditions. It is noted that the Bragg reflection condition may be satisfied when the refractive index layer is arranged to have a thickness at which the oscillation phase change may be equal to an odd number multiple of π/2.

It is noted that a selectively oxidized layer 108 made of p-AlAs is arranged at the mid-section of the upper DBR 107.

Also, a contact layer (not shown) made of GaAs is arranged on the uppermost face of the first multilayer structure.

The lower spacer layer 104, the multi-quantum well active layer 105, and the upper spacer 106 are collectively referred to as a resonator region, and this resonator region is arranged to achieve an optical phase change of 2π. In other words, the resonator region is arranged into a one-wavelength resonator structure. Also, the multi-quantum well active layer 105 is arranged in the middle of the one-wavelength resonator structure at a position corresponding to the anti-node of the standing wave of oscillation light.

It is noted that a semiconductor multilayer reflector (DBR) according to the prior art generally uses two types of materials having different refractive indexes and the two types of materials are alternatingly layered to reach a thickness at which an oscillation light phase change of π/2 is achieved (thickness satisfying the Bragg reflection condition). In the case of using AlGaAs materials, the refractive index is dependent on the Al composition (content); namely, the refractive index decreases as the Al content is increased. Accordingly, a multilayer reflector is generally made up of multiple layers of materials having differing thermal resistances, the thermal resistance of the multilayer reflector is largely dependent on the composition of the AlGaAs material used, and the characteristics of the layer with the greater thermal resistance becomes dominant in the multilayer reflector.

Particularly, in a surface emitting laser element that uses a wavelength shorter than the absorption edge wavelength of GaAs as the oscillation wavelength, AlGaAs material that is capable of transmitting oscillation light has to be used as the material of the semiconductor multilayer reflector. Accordingly, an AlGaAs material in mid-composition that has a relatively high thermal resistance is preferably used as the higher refractive index layer. However, there are limitations to the types of AlGaAs materials that may be used in the semiconductor multilayer reflector.

Figure 3:
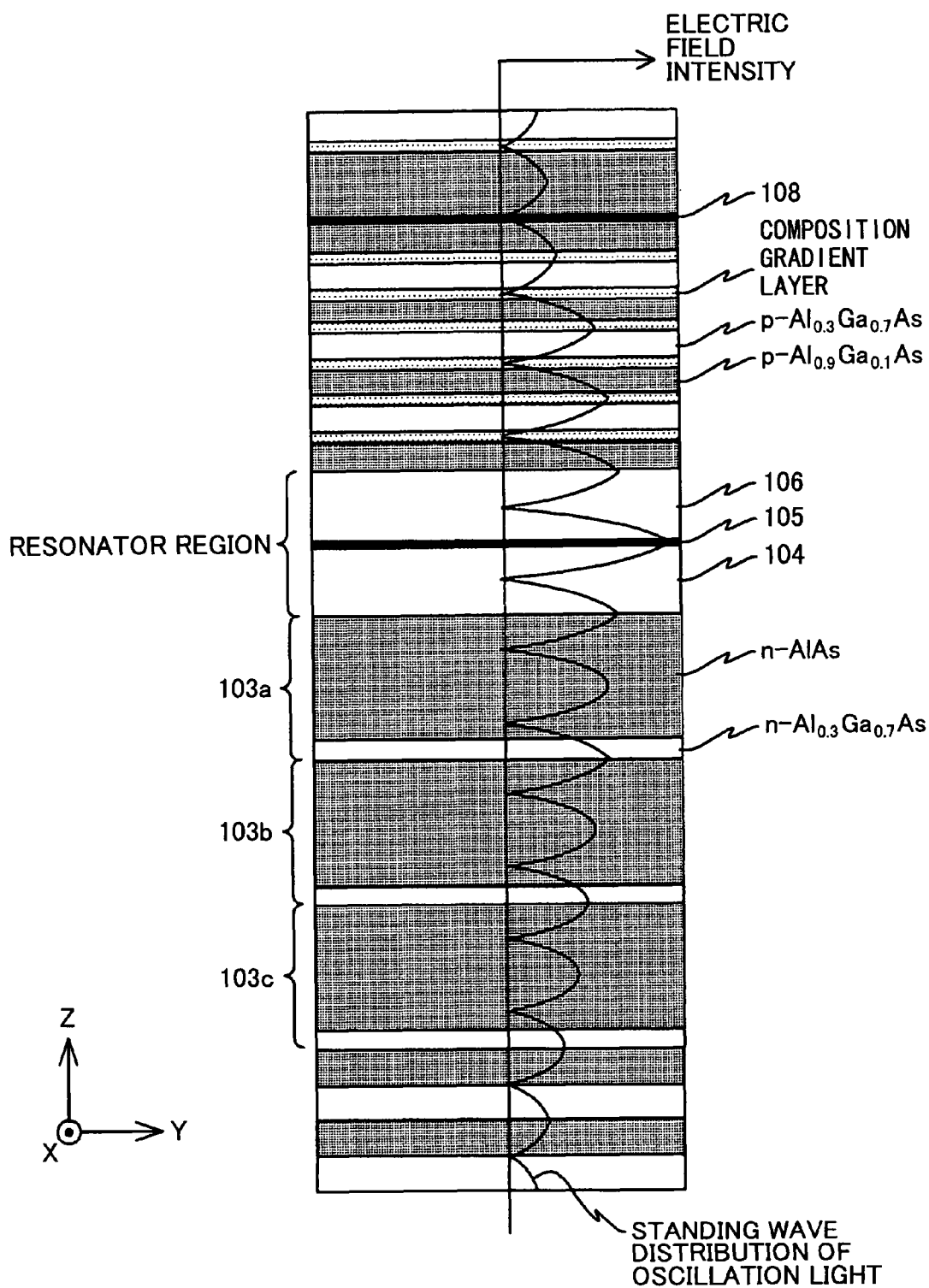
FIG. 3 is a diagram showing a layer configuration near a resonator region of the surface emitting laser element of FIG. 1.

As is shown in FIG. 3, according to the first embodiment of the present invention, three pairs of the refractive index layers (103a-103c) of the lower DBR 103 that are adjacent to the resonator region are arranged such that their lower refractive index layers have thicknesses at which the an oscillation light phase change of 7π/4 may be achieved (optical thickness of 7λ/8) and their higher refractive index layers have thicknesses at which an oscillation light phase change of π/4 may be achieved (optical thickness of λ/8).

Specifically, the three pairs of refractive index layers (103a-103c) of the lower DBR 103 that are adjacent to the resonator region are arranged such that the optical thicknesses of their refractive layers having the lower thermal resistance may be greater than ¼ of the oscillation wavelength and the optical thicknesses of their refractive layers having the higher thermal resistance may be less than ¼ of the oscillation wavelength. Also, the sum of the optical thickness of the refractive index layer with the lower thermal resistance and the optical thickness of the refractive index layer with the higher thermal resistance is arranged to be m/4 of the oscillation wavelength (m being an even number greater than or equal to 2; i.e., m=4 in the illustrated example). In FIG. 3, the standing wave distribution pattern of oscillation light in the oscillating state is shown along with the layer composition.

It is noted that the reflectance may be degraded when the optical thicknesses of all the lower refractive index layers and the higher refractive index layers within the lower DBR 103 are set to 7λ/8 and λ/8, respectively. Also, heat diffusion effects may not be adequately obtained even when thermal resistance is reduced at a location far away from the active layer. Thus, in the present embodiment, the optical thickness of the lower refractive index layer is set to 7λ/8 and the optical thickness of the higher refractive index layer is set to λ/8 in the three pairs of refractive index layers of the lower DBR 103 that are adjacent to the resonator region.

Figure 4:
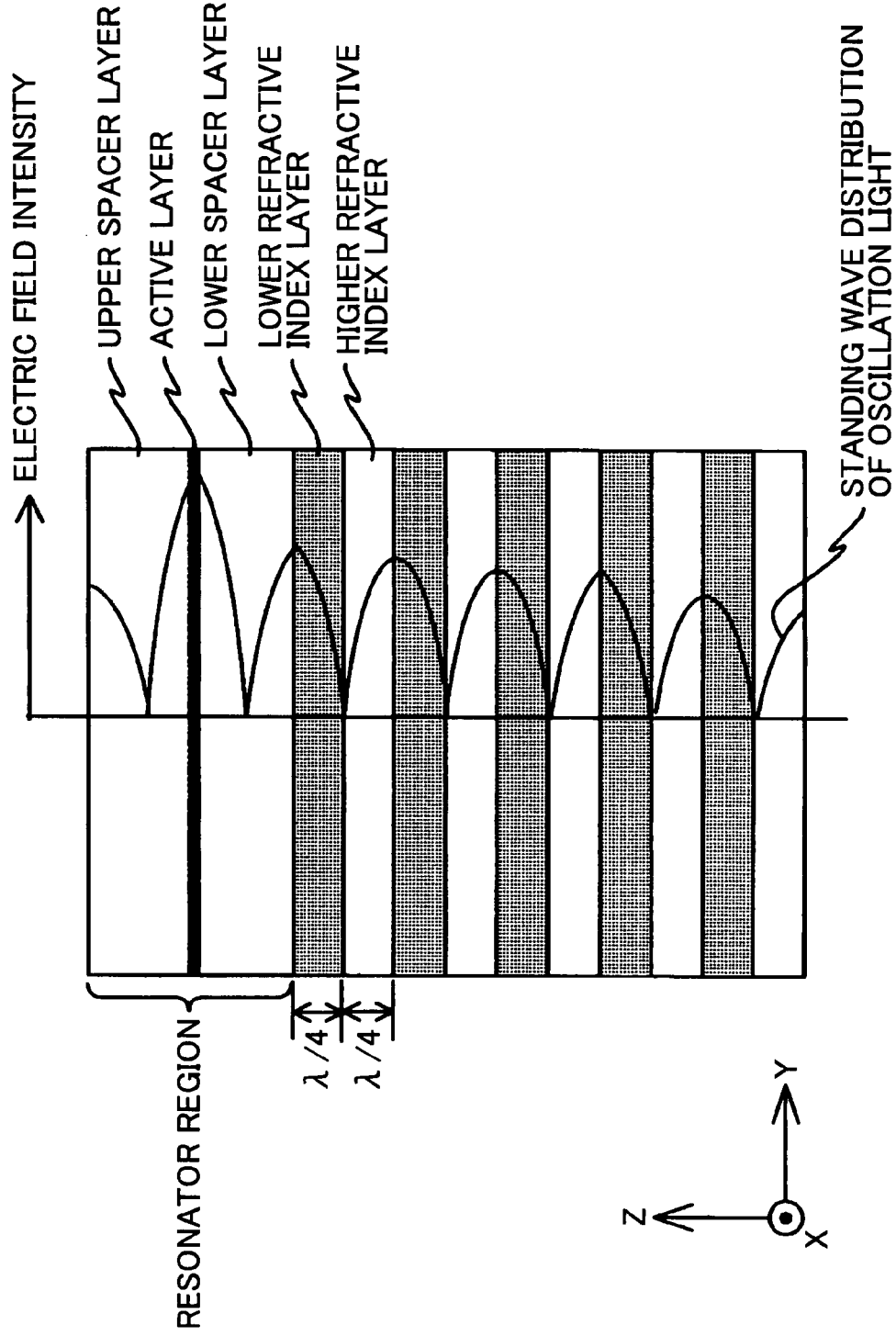
FIG. 4 is a diagram showing a layer configuration of a resonator region of a surface emitting laser element according to the prior art as a comparison example.

FIG. 4 shows a configuration of a lower DBR according to the prior art as a comparison example. In this example, the optical thicknesses of the lower refractive index layers and the higher refractive index layers of the lower DBR are all set to minimum optical thicknesses for satisfying their corresponding Bragg reflection conditions (i.e., λ/4).

According to the present embodiment, in the three pairs of refractive index layers (103a-103c) of the lower DBR 103 that are adjacent to the resonator region, the optical thickness of the lower refractive index layer with the lower thermal resistance is arranged to be at least three times the minimum optical thickness satisfying the Bragg reflectance condition, and the optical thickness of the higher refractive index layer with the higher thermal resistance is arranged to be less than the minimum optical thickness satisfying the Bragg reflectance condition.

(Fabrication Method)

In the following, a method of fabricating the surface emitting laser element 100 according to the present embodiment is described.

(1) The first multilayered structure is fabricated through crystal growth using metal organic chemical vapor deposition (MOCVD). It is noted that trimethylaluminum (TMA), trimethylgallium (TMG), and trimethylindium (TMI) are used as group III materials, and arsine ($AsH_3$) and phosphine ($PH_3$) are used as group V materials. Also, carbon bromide ($CBr_4$) is used as the p-type dopant material, and hydrogen selenide ($H_2Se$) is used as the n-type dopant material.

(2) A known photomechanical technique is used to form a square resist pattern with side dimensions of 20 μm at the center of the first multilayered structure. Then, a known dry etching technique is used to remove layers from the contact layer at the uppermost face down to the mid section of the lower spacer layer 104. The progress of the dry etching process may be determined by monitoring plasma emission using a plasma emission monitor, and determining the layer being etched based on information on the type of plasma emission that characteristically occurs in each of the layers subject to etching, for example. In the present embodiment, indium (In) is included in each of the spacer layers 104 and 106 so that the portion layer) being etched may be determined by monitoring In emission upon forming a mesa-shaped structure within the first multilayer structure using dry etching. Also, since In is not included in the upper and lower DBR 103 and 107, the resonator region including In may be accurately detected by monitoring the plasma emission. In this way, the etching depth may be accurately controlled.

(3) The selectively oxidized layer 108 is selectively oxidized from the side walls of the mesa structure in a heated vapor atmosphere to form a current narrowing layer. It is noted that since dry etching is stopped at mid section of the lower spacer 104, the AlAs layer making up the lower DBR 103 is not selectively oxidized. In FIG. 1, the selectively oxidized portion of the selectively oxidized layer 108 is indicated by black. Also, in the present embodiment, the non-oxidized portion of the selectively oxidized layer 108 is arranged into a square region having side dimensions of 4 µm.

(4) A known chemical vapor deposition (CVD) technique is used to arrange a $SiO_2$ layer 109 on the surface of the multilayer structure.

(5) The $SiO_2$ layer 109 arranged on a light emitting portion and its surrounding area is removed.

(6) Spin coating of insulating resin 110 is performed. The insulating resin 110 arranged on the upper face of the mesa structure is removed.

(7) A resist pattern having a square opening with side dimensions of 8 µm is formed on a region corresponding to the light emitting portion, and p side electrode material deposition is performed thereafter. Then, the p side electrode material deposited on the light emitting portion is removed through lift off to form a p-side electrode 111.

(8) After polishing the rear face of the substrate 101, an n-side electrode 112 is formed on the rear face of the substrate 101 through vapor deposition. Then, ohmic conduction between the p-side electrode 111 and the n-side electrode 112 is established through annealing.

As is described above, in the surface emitting laser element 100 according to the present embodiment, the optical thickness of the higher refractive index layer is arranged to be less than that of the prior art in the three pairs of refractive index layers (103a-103c) of the lower DBR 103 that are adjacent to the resonator region. In this way, the overall thermal resistance of the lower DBR 103 in a direction from the active layer 105 to the substrate 101 may be reduced compared to the prior art as is shown in FIG. 5. It is noted that the thermal resistance values shown in FIG. 5 are obtained using the finite element method.

Also, in the surface emitting laser element 100 according to the present embodiment, the optical thickness of the lower refractive index layer with the lower thermal resistance is arranged to be thicker than that of the prior art in the three pairs of refractive index layers (103a-103c) of the lower DBR 103 that are adjacent to the resonator region. In this way, the rate of thermal diffusion in horizontal directions (parallel directions with respect to the substrate 101) via the lower refractive index layer during conduction of heat from the active layer 105 to the substrate 101 may be increased.

Also, in the surface emitting laser element 100 according to the present embodiment, the sum of the optical thickness of the lower refractive index layer and the optical thickness of the higher refractive index layer is arranged to equal $\lambda$ in the three pairs of refractive index layers (103a-103c) of the lower DBR 103 that are adjacent to the resonator region. In this way, the reflectance wavelength (wavelength at which the maximum reflectance is obtained) may be prevented from changing and high reflectance may be maintained.

Also, in the surface emitting laser element 100 according to the present embodiment, the lower refractive index layer with a lower thermal resistance and an optical thickness that is thicker than that of the prior art is arranged next to the resonator region so that the heat generated at the active layer 105 may be effectively diffused in horizontal directions (parallel directions with respect to the substrate 101).

Also, in the surface emitting laser element 100 according to the present embodiment, the lower spacer layer 104 is used as the bottom face of the mesa-shaped structure so that the lower DBR 103 may not be exposed to the side faces of the mesa structure and is prevented from being oxidized in the selective oxidization process. Thus, AlAs having the lowest thermal resistance among the AlGaAs materials may be used as the material of the lower refractive index layer of the lower DBR 103.

In turn, heat diffusion characteristics may be improved compared to the prior art in the surface emitting laser element according to the present embodiment. As a result, heat generated at the active layer 105 may be effectively removed and the temperature increase in the active layer 105 may be reduced so that higher optical power may be achieved compared to the prior art.

Also, in the surface emitting laser element according to the present embodiment, the spacer layer 104 includes indium (In) so that In emission may be monitored during the etching process to enable accurate control of the etching depth. It is noted that portions the active layer 105 may also be etched and removed in order to realize electrical isolation from neighboring device elements, for example.

Figure 6:
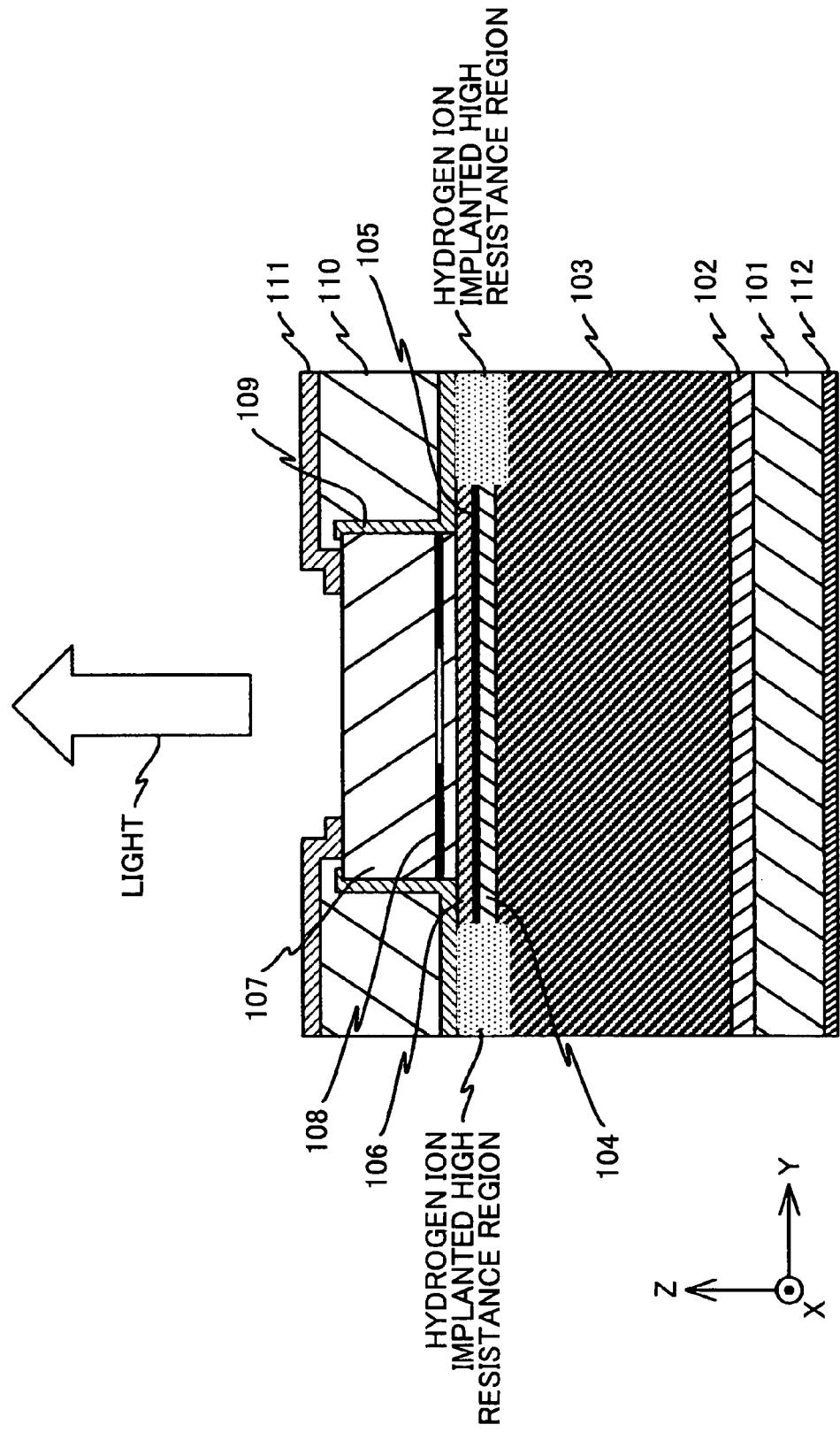
FIG. 6 is a diagram illustrating a case of creating a high resistance region through hydrogen ion implantation in an alternative example for fabricating the surface emitting laser element according to the first embodiment.

In an alternative example, the etching process may be stopped at mid section of the upper spacer layer 106 and the active layer 105 may be left behind. In this case, since the active layer 105 is not etched and extends in horizontal directions, heat generated at the active layer 105 may be diffused in the horizontal directions (parallel directions with respect to the substrate 101). However, when the active layer 105 extends in the horizontal directions, it may realize electrical conduction with respect to its neighboring device elements. To counter such an effect, in one preferred embodiment as is shown in FIG. 6, a known photomechanical technique may be used to create a square resist pattern on the upper face of the mesa structure, and a known ion implantation technique may be used to implant hydrogen ions in neighboring regions of the mesa structure to thereby increase the resistance of the ion implanted regions and isolate the active layer 105 from its neighboring device elements.

It is noted that in the above-described first embodiment of the present invention, dry etching is performed to create the mesa structure. However, the present invention is not limited to such an embodiment, and other methods such as wet etching may be used to create the mesa structure as well.

Also, in the above-described first embodiment of the present invention, both the lower spacer layer 104 and the upper spacer layer 106 include In. However, the present invention is not limited to such an embodiment, and only the lower spacer layer 104 may include In, for example. In this case, the lower spacer layer 104 may be used as an etching stopper layer upon performing wet etching on the first multilayered structure, and the etching depth may be accurately controlled by performing selective etching using a sulfate etchant. However, it is noted that an asymmetric mesa structure may be easily created due to etching anisotropy in this case so that dry etching is preferably used in conjunction with wet etching. However, it is also possible to remove all layers from the contact layer to the lower spacer layer 104 through wet etching.

Figure 7:
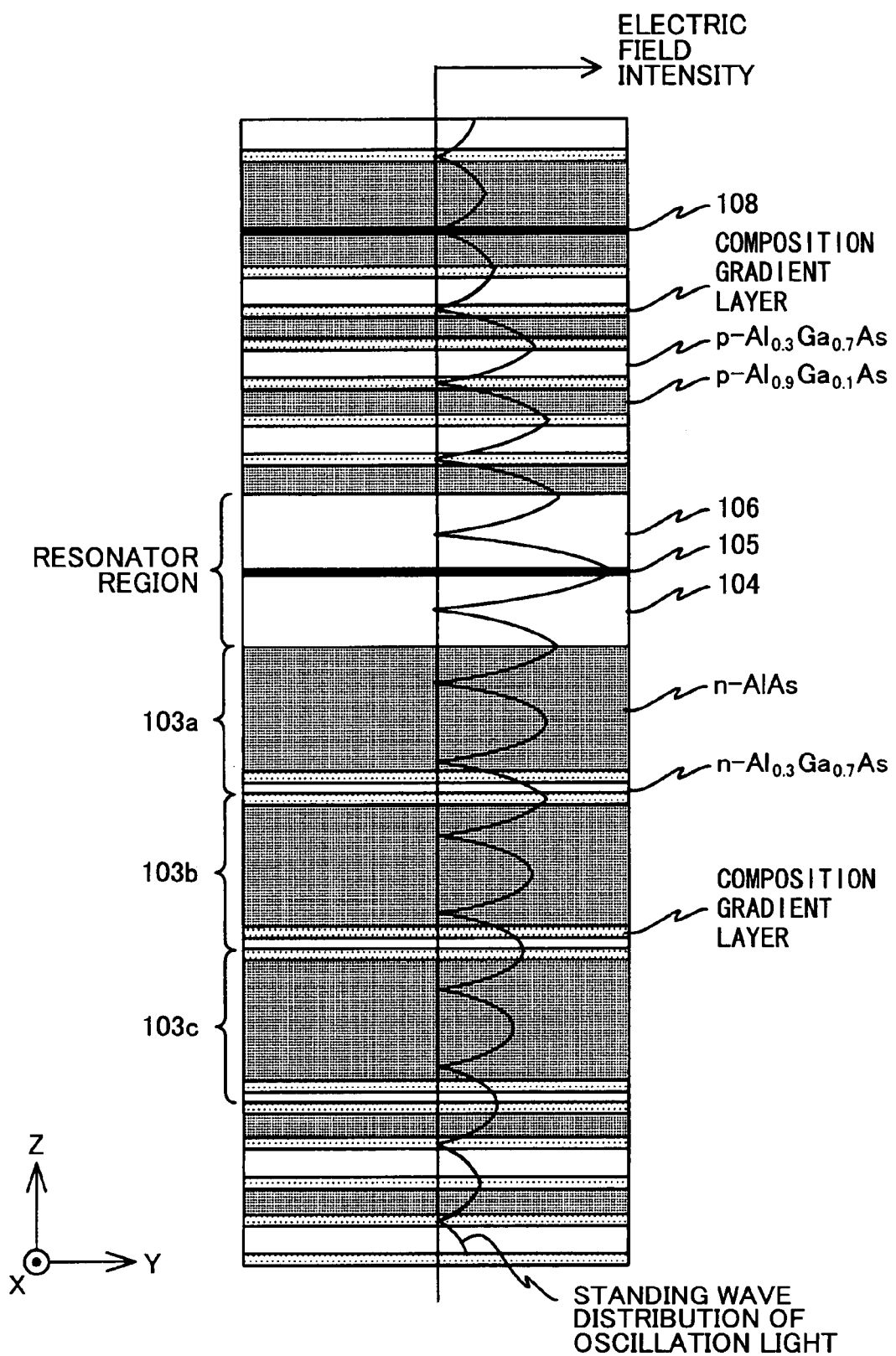
FIG. 7 is a diagram illustrating a first modified example of the surface emitting laser element of FIG. 1.

Also, in the above-described first embodiment of the present invention, the composition gradient layer is only arranged in the upper DBR 107. However, the present invention is not limited to such an arrangement, and in another embodiment as is shown in FIG. 7, the composition gradient layer may also be arranged in the lower DBR 103. In this way, the electrical resistance of the lower DBR 103 may be reduced further. In this case, a region including the lower refractive index layer and a portion of the composition gradient layer is arranged to achieve an oscillation light phase change of $7\pi/8$, and a region including the higher refractive index layer and the remaining portion of the composition gradient layer is arranged to achieve an oscillation light phase change of $\pi/8$. Also, the region including the lower refractive index layer, the composition gradient layer, and the higher refractive index layer is arranged to achieve an oscillation light phase change of $2\pi$ so that high reflectance may be maintained.

Figure 8:
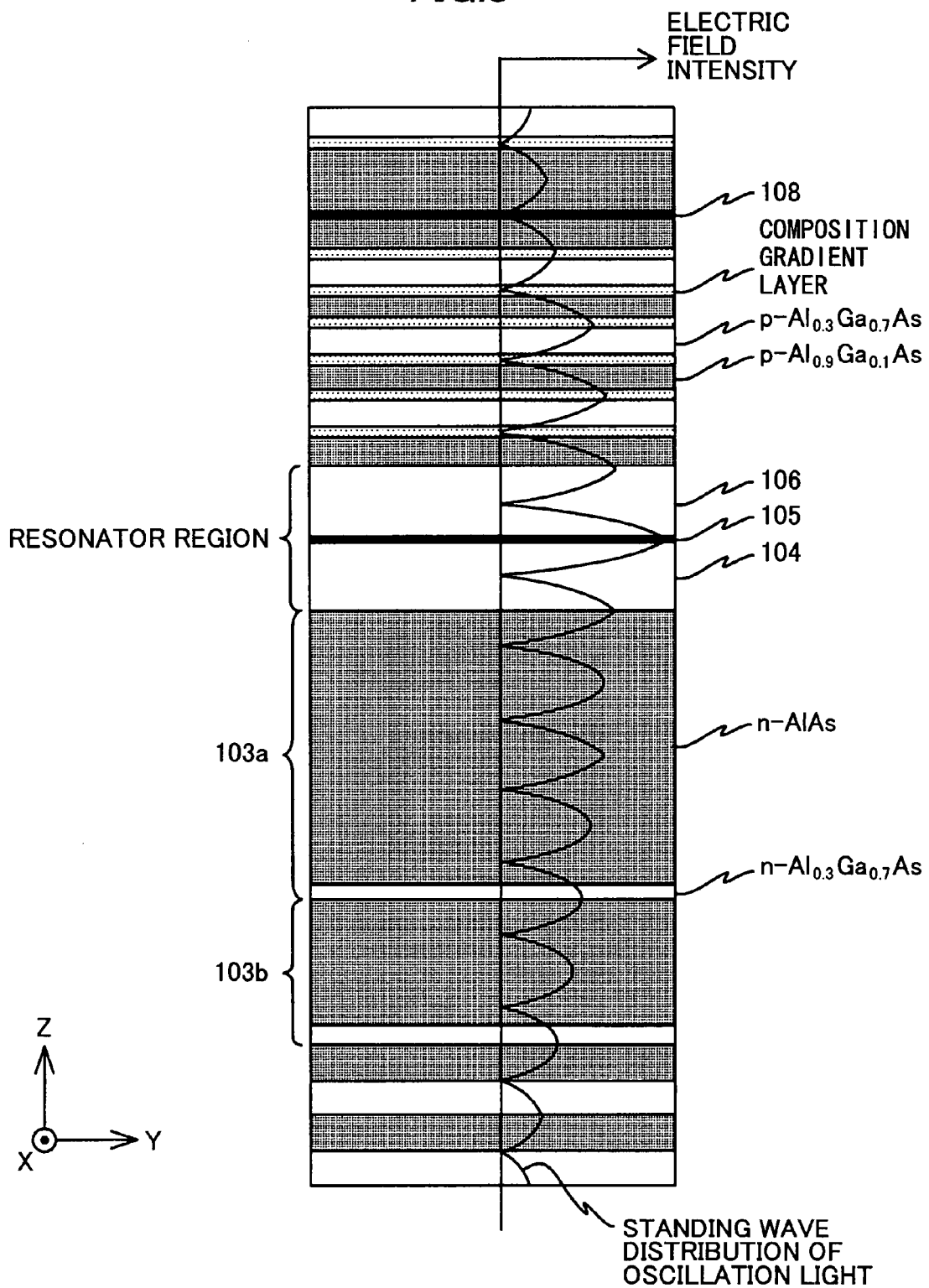
FIG. 8 is a diagram illustrating a second modified example of the surface emitting laser element of FIG. 1.

Also, in the above-described first embodiment of the present invention, the lower refractive index layers of the three pairs of refractive index layers of the lower DBR 103 adjacent to the resonator region are arranged to have optical thicknesses of $7\lambda/8$. However, the present invention is not limited to such an embodiment, and in another embodiment as is shown in FIG. 8, the lower refractive index layer of the pair of refractive index layers 103a closest to the resonator region may be arranged to have an optical thickness of $15\lambda/8$, and the higher refractive index layer may be arranged to have optical thicknesses of $\lambda/8$. In this way, heat diffusion in the horizontal directions (parallel directions with respect to the substrate 101) may be accelerated. In this case, the sum of the optical thickness of the lower refractive index layer and the optical thickness of the upper refractive index layer of the pair of refractive index layers 103a closest to the resonator region is arranged to be $2\lambda$ (where m=8), and high reflectance may be maintained.

Also, in the illustrated embodiment of FIG. 8, the lower refractive index layer of the pair of refractive index layers 103b that is next to the closest pair 103a is arranged to have an optical thickness of $7\lambda/8$, and the higher refractive index layer of the pair 103b is arranged to have an optical thickness of $\lambda/8$. As can be appreciated from the above descriptions, the lower refractive index layers of the pairs of refractive index layers adjacent to the resonator region may be arranged to have differing optical thicknesses.

Figure 9:
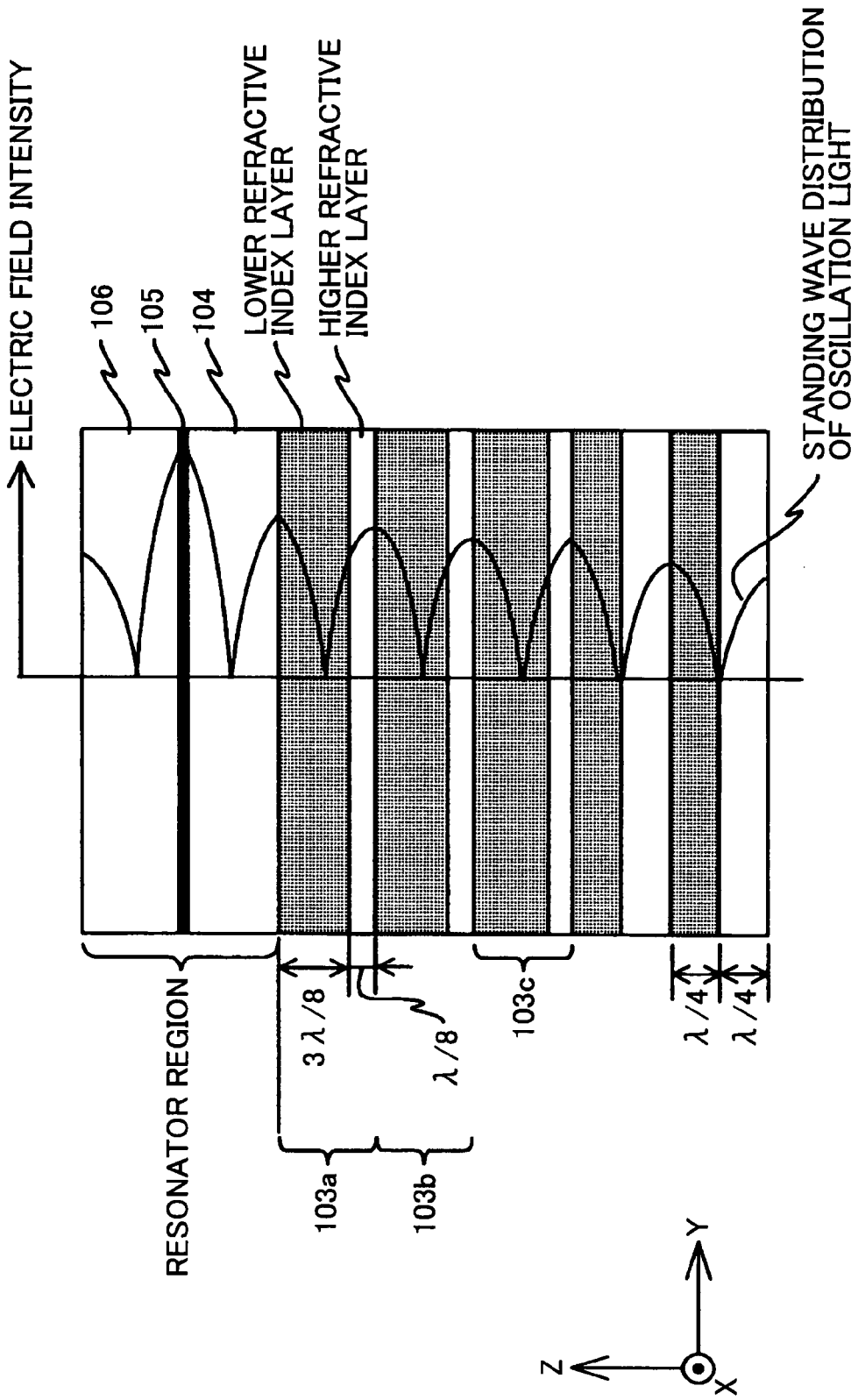
FIG. 9 is a diagram illustrating a third modified example of the surface emitting laser element of FIG. 1.

In another embodiment as is shown in FIG. 9, the lower refractive index layers of the three pairs of refractive index layers of the lower DBR 103 that are adjacent to the resonator region may each be arranged to have optical thicknesses of $3\lambda/8$, and the higher refractive index layers may be arranged to have optical thicknesses of $\lambda/8$. In this case, the sum of the optical thickness of the lower refractive index layer and the optical thickness of the higher refractive index layer is equal to $\lambda/2$ (where m=2) in the three pairs of refractive index layers of the lower DBR 103 adjacent to the resonator region so that high reflectance may be maintained.

Also, in the above-described first embodiment of the present invention, each of the three pairs of refractive index layers of the lower DBR 103 adjacent to the resonator region is arranged such that the refractive index layer with the higher thermal resistance has an optical thickness less than ¼ of the oscillation wavelength, and the refractive index layer with the lower thermal resistance has an optical thickness greater than ¼ of the oscillation wavelength. However, the present invention is not limited to such an embodiment, and for example, one pair of refractive index layers of the lower DBR 103 adjacent to the resonator region may be arranged such that the refractive index layer with the higher thermal resistance has an optical thickness less than ¼ of the oscillation wavelength, and the refractive index layer with the lower thermal resistance has an optical thickness greater than ¼ of the oscillation wavelength. In another example, each of five pairs of refractive index layers of the lower DBR 103 adjacent to the resonator region may be arranged such that the refractive index layer with the higher thermal resistance has an optical thickness less than ¼ of the oscillation wavelength, and the refractive index layer with the lower thermal resistance has an optical thickness greater than ¼ of the oscillation wavelength.

Figure 10:
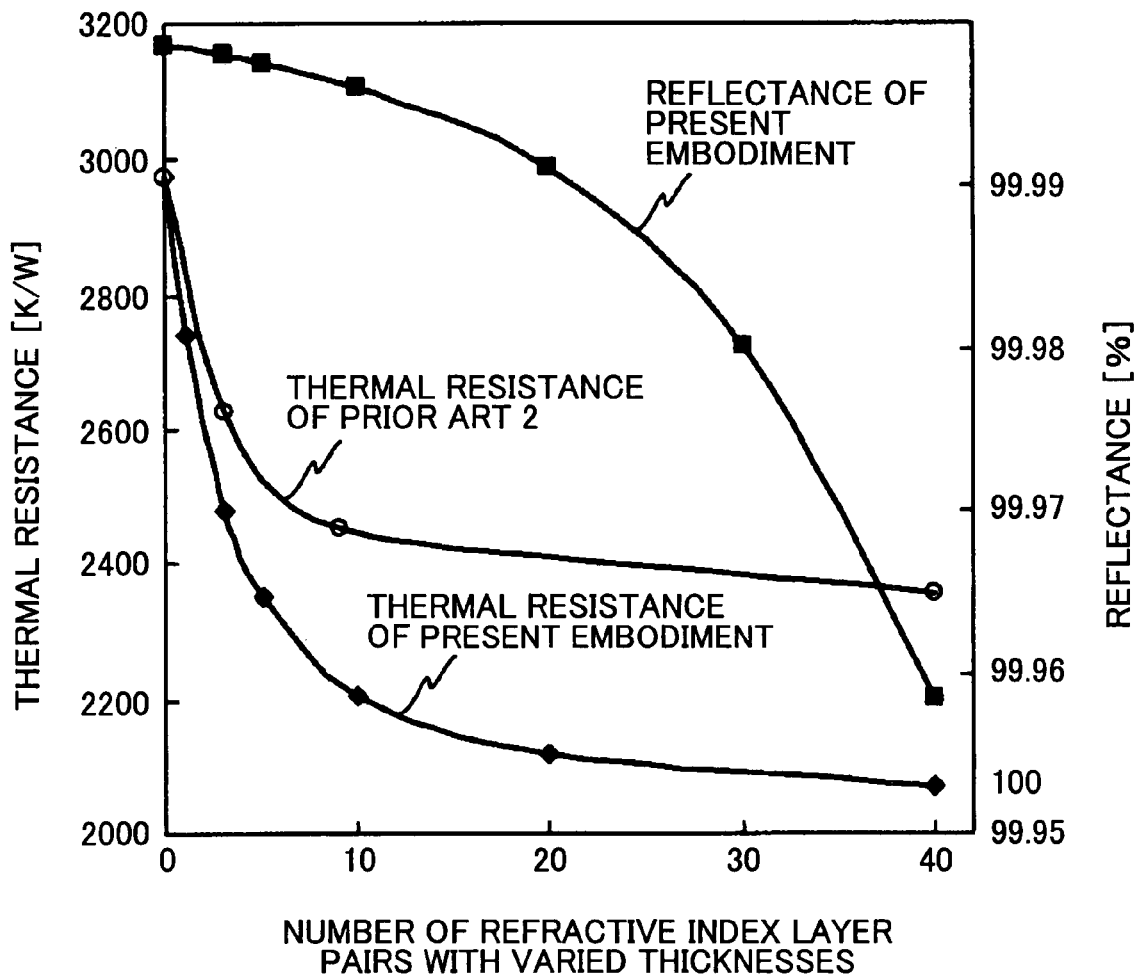
FIG. 10 is a graph illustrating a decrease in thermal resistance in relation to a decrease in the optical thickness of a higher refractive index layer.

FIG. 10 is a graph illustrating the decrease in thermal resistance in relation to reduction of the optical thickness of the higher refractive index layer. Specifically, the graph of FIG. 10 shows the thermal resistance and the reflectance of a surface emitting laser element that uses 40.5 pairs of $Al_{0.3}Ga_{0.7}As/AlAs$ layers as a multilayer reflector on the substrate side in which the interface of each of the pairs other than one or more of those at the active layer side is formed at an optical thickness of $\lambda/4$ (i.e., the composition gradient layer is not included). A number of the pairs of the multilayer reflector on the active layer side are arranged to have the configuration of the pairs of reflective index layers 103a-103c of the above-described first embodiment of the present invention (i.e., where the thicknesses of the higher and lower refractive index layers are varied).

It is noted that in the graph of FIG. 10, the horizontal axis represents the number of pairs that are arranged to have the configuration of the pair of refractive index layers according to the above-described first embodiment of the present invention. As is described above, the configuration of the pair of refractive index layers according to the first embodiment of the present invention arranges the higher refractive index layer with the higher thermal resistance to have an optical thickness less than $\lambda/4$. In the present example, the $Al_{0.3}Ga_{0.7}As$ layer (higher refractive index layer) of one or more of the relevant pairs at the active layer side is arranged to have an optical thickness of $\lambda/8$, and the AlAs layer (lower refractive index layer) is arranged to have an optical thickness of $7\lambda/8$. Also, the optical thickness of the two layers making up one pair of refractive index layers is arranged to be an integer multiple of $\lambda/2$ (i.e., the optical thickness is $\lambda$ in the present example).

It is noted that in the graph of FIG. 10, the thermal resistance of a prior art example as is disclosed in Japanese Laid-Open Patent Publication 2005-354061 (referred to as PRIOR ART 2 in FIGS. 5 and 10) is shown as a comparison example. In this prior art example, relevant pairs of refractive index layers at the active layer side are arranged such that the higher refractive index layer has an optical thickness of $\lambda/4$ and the lower refractive index layer has an optical thickness of $3\lambda/4$.

By comparing the thermal resistance of the prior art example with that according to the first embodiment of the present invention in FIG. 10, it may be appreciated that the thermal resistance of the first embodiment of the present invention may be reduced compared to that of the prior art example. Also, as can be appreciated from the graph of FIG. 10, the lowest thermal resistance may be achieved by arranging all the pairs of $Al_{0.3}Ga_{0.7}As/AlAs$ layers to have the configuration according to the first embodiment of the present invention.

By using the multilayer reflector configuration according to the first embodiment of the present invention as the reflector of a surface emitting laser element, the thermal resistance may be reduced and higher optical power may be achieved compared to the prior art, for example.

On the other hand, as can be appreciated from FIG. 10, when the number of pairs of $Al_{0.3}Ga_{0.7}As/AlAs$ layers that are arranged to have the reflector layer configuration according to the first embodiment is increased, the reflectance tends to decrease. Thus, it may not be desirable to include too may pairs of $Al_{0.3}Ga_{0.7}As/AlAs$ layers having the reflector layer configuration according to the first embodiment in view of the reflectance of the surface emitting laser element. As can be appreciated from FIG. 10 a relatively significant change in thermal resistance occurs until the tenth pair after which the change enters a saturated range from the tenth pair to the twentieth pair. Accordingly, the number of pairs arranged to have the reflector layer configuration according to the first embodiment may preferably be within twenty (20) pairs so that the thermal resistance may be reduced while maintaining a relatively high reflectance.

By using a multilayer reflector having a number of reflector layer pairs within twenty pairs arranged to have the reflector layer configuration according to the first embodiment of the present invention in a surface emitting laser element, the optical power may be increased while maintaining the threshold current to a relatively low level.

Second Embodiment

Figure 11:
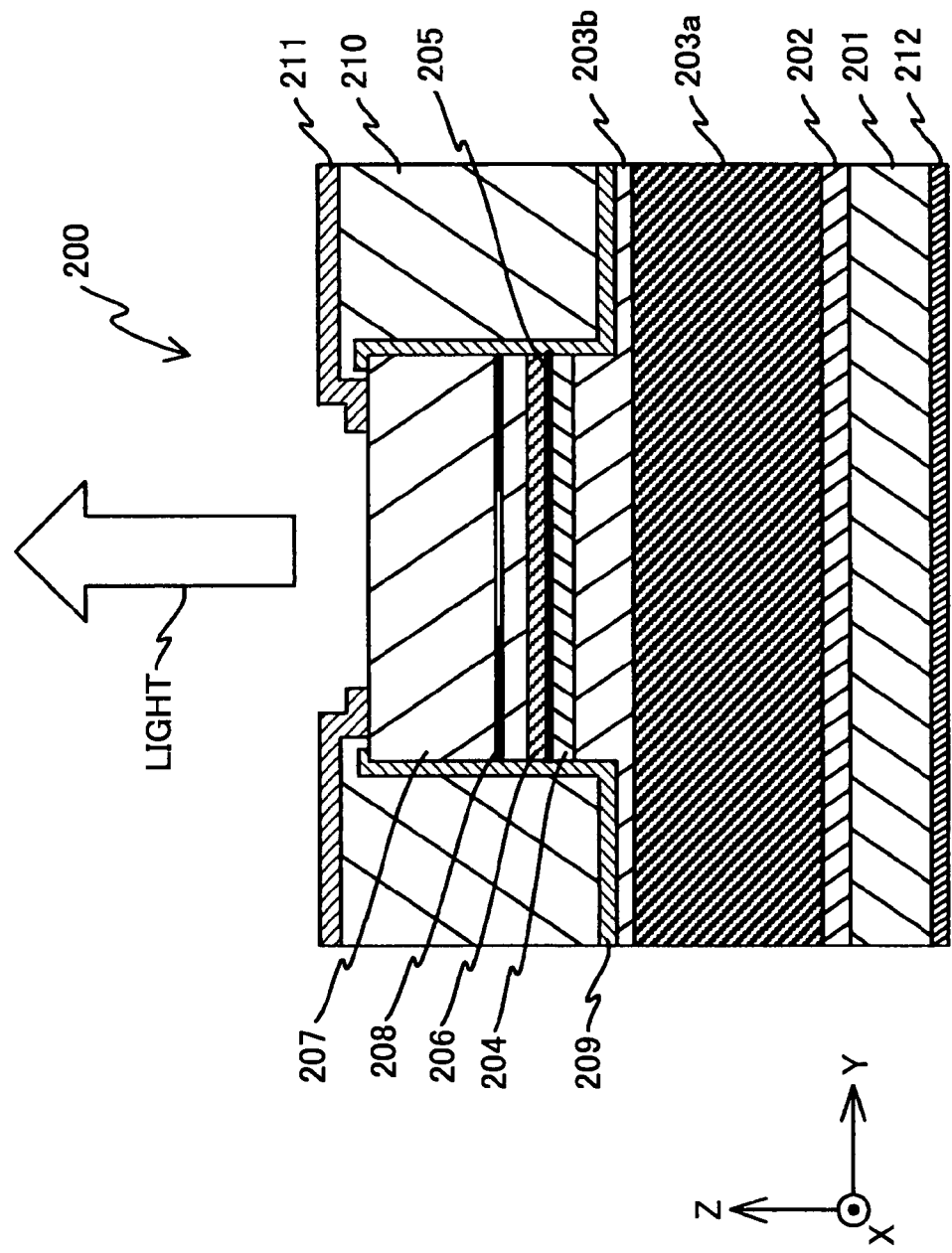
FIG. 11 is a diagram showing a configuration of a surface emitting laser element according to a second embodiment of the present invention.

A second embodiment of the present invention is described below with reference to FIGS. 11 and 12. FIG. 11 is a diagram showing an overall configuration of a vertical cavity surface emitting laser element 200 according to the second embodiment of the present invention.

The illustrated surface emitting laser element 200 according to the second embodiment is a 1.3-μm-band surface emitting laser element that has a substrate 201 and semiconductor layers including a buffer layer 202, a first lower DBR 203a, a second lower DBR 203b, a lower spacer layer 204, a multi-quantum well active layer 205, an upper spacer layer 206, and an upper DBR 207, for example, that are successively layered on the substrate 201 in this order. It is noted that in the following descriptions, the above multilayer structure of the semiconductor layers are referred to as 'second multilayer structure' hereinafter.

In the present example, the substrate 201 is made of n-GaAs.

The buffer layer 202 is made of n-GaAs.

The first lower DBR 203a includes 32.5 pairs of refractive index layers each including a lower refractive index layer made of n-AlAs and a higher refractive index layer made of n-GaAs. In other words, the lower refractive layers and the higher refractive layers are alternately layered to form the first lower DBR 203a.

The second lower DBR 203b includes 3 pairs of refractive index layers each including a lower refractive index layer made of $n-Al_{0.9}Ga_{0.1}As$ and a higher refractive index layer made of n-GaAs. In other words, the lower refractive index layers and the higher refractive index layers are alternately layered to form the second lower DBR 203b. It is noted that the thermal resistance of $Al_{0.9}Ga_{0.1}As$ is 3.9 cm K/W, which is greater than the thermal resistance of GaAs (2.3 cm K/W). Therefore, in the second lower DBR 203b, the thermal resistance of the lower refractive index layer is greater than the thermal resistance of the higher refractive index layer. That is, according to the second embodiment of the present invention, the lower refractive index layer has a higher thermal resistance and the higher refractive index layer has a lower thermal resistance. Also, it is noted that both $Al_{0.9}Ga_{0.1}As$ and GaAs are materials with low oxidization speeds.

The lower spacer layer 204 is made of non-doped GaAs.

The multi-quantum well active layer 205 is made of GaIn-PAs/GaAs.

The upper spacer layer 206 is made of non-doped GaAs.

The upper DBR 207 includes 26 pairs of refractive index layers each including a lower refractive index layer made of $p-Al_{0.9}Ga_{0.1}As$ and a higher refractive index layer made of p-GaAs. That is, the lower refractive index layers and the higher refractive index layers are alternatingly layered to form the upper DBR 207. It is noted that a composition gradient layer with a thickness of 20 nm in which the layer composition gradually changes from one layer composition to the other layer composition is provided between the lower refractive index layer and the higher refractive index layer in order to reduce electrical resistance. It is noted that the combined thickness of the lower refractive index layer and a portion of the composition gradient layer and the combined thickness of the higher refractive index layer and the remaining portion of the composition gradient layer are arranged to satisfy their corresponding Bragg reflection conditions.

It is noted that a selectively oxidized layer 208 made of p-AlAs is arranged at the mid-section of the upper DBR 207.

Also, a contact layer made of GaAs (not shown) is arranged on the uppermost face of the second multilayer structure.

Figure 12:
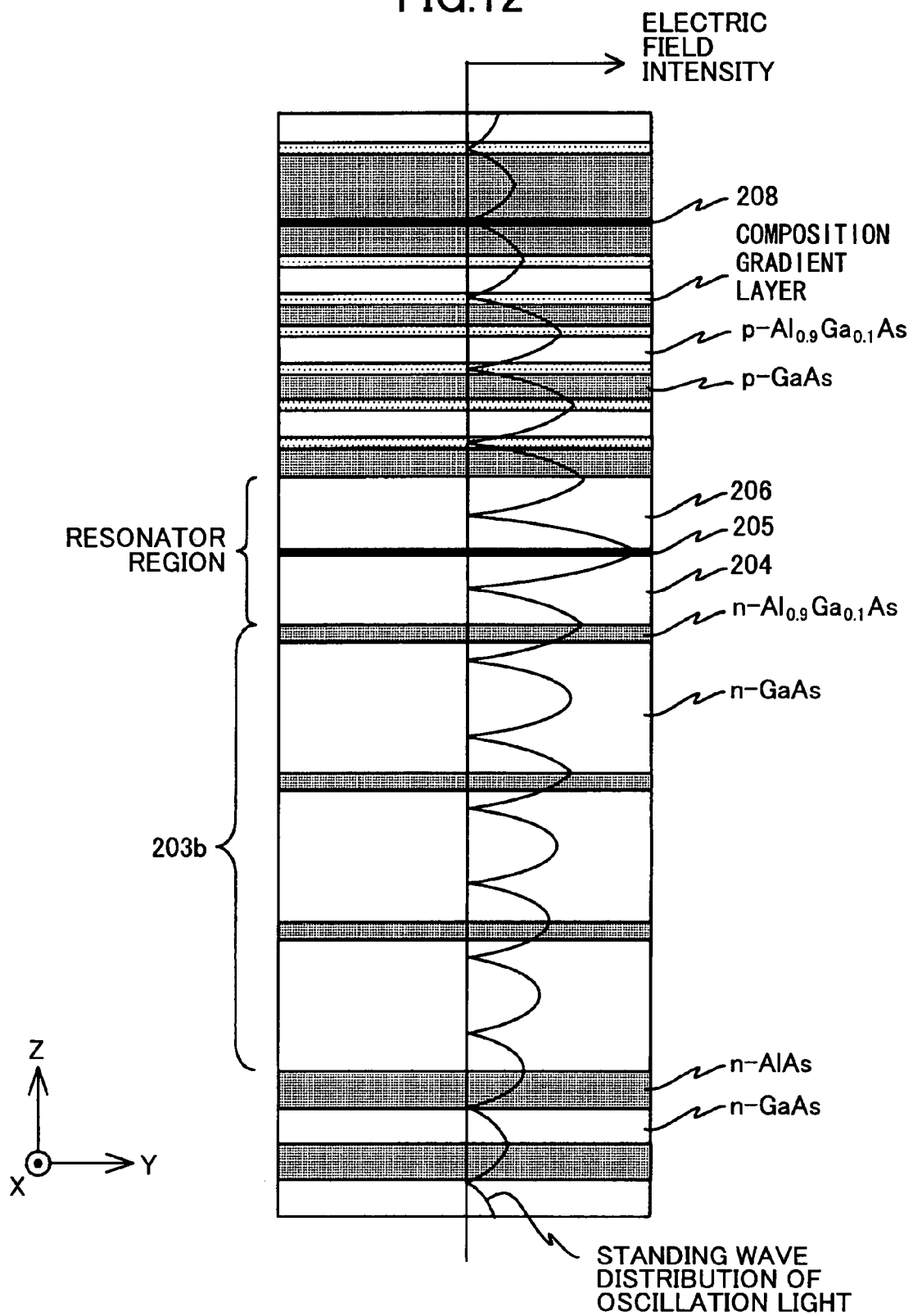
FIG. 12 is a diagram showing a layer configuration near a resonator region of the surface emitting laser element of FIG. 11.

As is shown in FIG. 12, according to the second embodiment of the present invention, the three pairs of refractive index layers of the second lower DBR 203b are arranged such that their lower refractive index layers have optical thicknesses at which an oscillation light phase change of $\pi/4$ may be achieved within the corresponding lower refractive index layers (i.e., optical thickness of $\lambda/8$), and their higher refractive index layers have optical thicknesses at which an oscillation light phase change of $7\pi/4$ may be achieved within the corresponding higher refractive index layers (i.e., optical thickness of $7\lambda/8$).

That is, in the three pairs of refractive index layers of the second lower DBR 203b, the optical thickness of the refractive index layer with the lower thermal resistance is arranged to be greater than ¼ of the oscillation wavelength, and the optical thickness of the refractive index layer with the higher thermal resistance is arranged to be less than ¼ of the oscillation wavelength. Also, the sum of the optical thickness of the refractive index layer with the higher thermal resistance and the optical thickness of the refractive index layer with the lower thermal resistance is arranged to be 4/4 of the oscillation wavelength (where m=4). In FIG. 12, the standing wave distribution of oscillation light in during oscillation is illustrated along with the layer configuration of the second multilayer structure.

It is noted that the surface emitting laser element 200 according to the second embodiment of the present invention may be fabricated in a manner similar to that for fabricating the surface emitting laser element 100 according to the first embodiment. Also, it is noted that in FIG. 11, a $SiO_2$ layer 209, an insulating resin layer 210, a p-side electrode, and an n-side electrode are shown.

As can be appreciated from the above descriptions, in the surface emitting laser element 200 according to the second embodiment of the present invention, the optical thickness of the lower refractive index layer with the higher thermal resistance is arranged to be less than that of the prior art in the three pairs of refractive index layers of the second lower DBR 203b. In this way, the overall thermal resistance of the lower DBR with respect to the direction from the active layer 205 to the substrate 201 may be reduced compared to the prior art.

Also, in the surface emitting laser element 200 according to the second embodiment of the present invention, the optical thickness of the higher refractive layer with the lower thermal resistance is arranged to be greater than that of the prior art in the three pairs of refractive index layers of the second lower DBR 203b. In this way, the rate of heat diffusion in the horizontal directions (parallel directions with respect to the substrate 201) via the higher refractive index layer may be increased during conduction of heat from the active layer 205 to the substrate 201.

Also, in the surface emitting laser element 200 according to the second embodiment of the present invention, the sum of the optical thickness of the lower refractive index layer and the optical thickness of the higher refractive index layer is arranged to equal λ in the three pairs of refractive index layers of the second lower DBR 203b. In this way, the reflectance wavelength may be prevented from changing, and a relatively high reflectance may be maintained.

Also, in the surface emitting laser element 200 according to the second embodiment of the present invention, n-$Al_{0.9}Ga_{0.1}As$ is used as the lower refractive index layer and n-GaAs is used as the higher refractive index layer in the three pairs of refractive index layers of the second lower DBR 203b. In this way, the second lower DBR 203b may be prevented from being oxidized in the selective oxidization process.

Also, in the surface emitting laser element 200 according to the second embodiment of the present invention, a mesa structure with the second lower DBR 203b forming the bottom face is created so that the first lower DBR 203a may not be exposed from the side face of the mesa structure to be oxidized in the selective oxidation process. Accordingly, AlAs, which has the lowest thermal resistance among AlGaAs materials, may be used as the material of the lower refractive index layer of the first lower DBR 203a.

In this way, heat diffusion properties may be improved in the surface emitting laser element 200 according to the present embodiment compared to that of the prior art. Consequently, heat generated at the active layer 205 may be effectively removed and temperature increase in the active layer 205 may be reduced so that higher optical power may be achieved in the surface emitting laser element according to the present embodiment.

It is noted that although the second lower DBR 203b includes three pairs of refractive index layers in the above-described second embodiment of the present invention, the present invention is not limited to such an embodiment.

Also, it is noted that the semiconductor material used for the DBR has to be transparent in the wavelength band at which it is used. Specifically, the band gap of the semiconductor material used has to be smaller than the oscillation wavelength band gap. Since the band gap of GaAs is 1.42 eV, the wavelength of light that may be transmitted through the semiconductor material of the DBR has to be at least 872 nm. Therefore, GaAs may be used as the material of the DBR of a surface emitting laser element that emits light of at least 872 nm, preferably slightly above this wavelength to be on the safe side. For example, a DBR made of AlGaAs material that includes a higher refractive index layer made of GaAs may be used in a 980 nm band surface emitting laser element. Since light at 980 nm is 1.26 eV, such a surface-emitting laser element uses light with a wavelength that is 160 meV longer than the absorption edge of GaAs. For example, in "IEEE 16th International Semiconductor Laser Conference (ISLC 1998)", Oct. 4-8, 1998, Nara, Japan, an exemplary semiconductor laser element is disclosed that uses AlAs as the lower refractive index layer and GaAs as the higher refractive index layer for light with a wavelength of 950 nm. According to such disclosures, GaAs may be used as the material of the higher refractive index layer of the DBR of a surface emitting laser with an oscillation wavelength of up to 950 nm.

In the surface emitting laser element 200 according to the second embodiment of the present invention, GaAs may be used as the material of the DBR of a surface emitting laser element with an oscillation wavelength that is greater than or equal to 950 nm. In this way a DBR with lower thermal resistance may be obtained, and in turn, a surface emitting laser element with superior heat diffusion properties, high yield, and high optical power may be obtained.

It is noted that in a case where AlAs is used as the lower DBR, normally, the etching depth has to be accurately controlled to avoid exposing the AlAs during the etching process for creating the mesa structure. However, in the surface emitting laser element 200 according to the second embodiment of the present invention, since the higher refractive index layer and the lower refractive index layer of the lower DBR are both made of material with a low oxidization speed, the refractive layers may be prevented from being oxidized in the selective oxidization process even when the edge face of the lower DBR is exposed by the etching process and a high yield may be obtained, for example.

Also, in one embodiment, the upper DBR may also be arranged to have the configuration of the lower DBR of the surface emitting laser element 200. In one particular example, a portion of the upper DBR close to the active layer may be arranged to have the configuration of the second lower DBR of the surface emitting laser element 200 so that thermal resistance of a heat diffusion path may be reduced for spreading heat generated at the active layer as the heat source toward the substrate side to a heat sink so that heat from the active layer may be efficiently diffused in horizontal directions.

Third Embodiment

Figure 13:
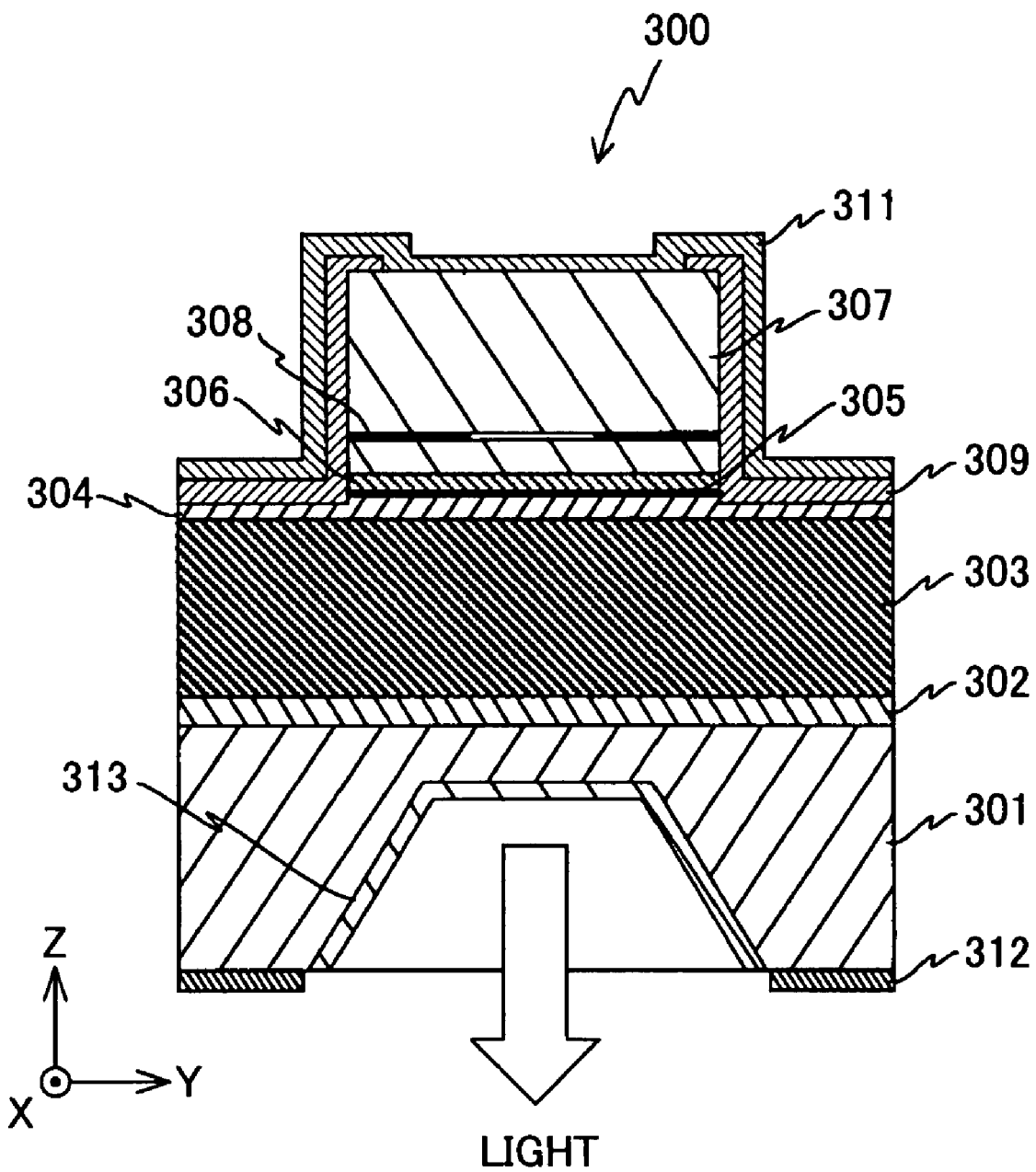
FIG. 13 is a diagram showing a configuration of a surface emitting laser element according to a third embodiment of the present invention.

A third embodiment of the present invention is described below with reference to FIGS. 13 and 14. FIG. 13 is a diagram showing a configuration of a vertical cavity surface emitting laser element 300 according to the third embodiment of the present invention.

The illustrated surface emitting laser element 300 is a 1.3-μm-band junction-down type surface emitting laser element that has a substrate 301 and semiconductor layers including a buffer layer 302, a lower DBR 303, a lower spacer layer 304, a DQW quantum well active layer 305, an upper spacer layer 306, and an upper DBR 307, for example, that are successively layered on the substrate 301 in this order. It is noted that in the following descriptions, the above multilayer structure of the semiconductor layers is referred to as 'third multilayer structure' hereinafter.

In a junction-down type surface emitting laser element, a heat sink is connected to the substrate surface side at which a light emitting layer is arranged. Since a substrate is not arranged between the active layer as the heat source and the heat sink, the distance between the heat source and the heat sink is significantly shorter in the junction-down type surface emitting laser element compared to a surface emitting laser element having a heat sink arranged at the rear face side of the substrate. Accordingly, the thermal resistance between the heat source and the heat sink in the junction-down type surface emitting laser element is relatively low.

In the present example, the substrate 301 is made of n-GaAs.

The buffer layer 302 is made of n-GaAs.

The lower DBR 303 includes 35.5 pairs of refractive index layers each including a lower refractive index layer made of n-AlAs and a higher refractive index layer made of n-GaAs. In other words, the lower refractive layers and the higher refractive layers are alternatingly layered to form the lower DBR 303. It is noted that a composition gradient layer with a thickness of 20 nm in which the layer composition gradually changes from one layer composition to the other layer composition is provided between the lower refractive index layer and the higher refractive index layer in order to reduce electrical resistance. The combined thickness of the lower refractive index layer and a portion of the composition gradient layer and the combined thickness of the higher refractive index layer and the remaining portion of the composition gradient layer are arranged to satisfy their corresponding Bragg reflection conditions.

The lower spacer layer 304 is made of non-doped GaAs.

The DQW quantum well active layer 305 is made of $Ga_{0.7}In_{0.3}N_{0.01}As_{0.99}$/GaAs.

The upper spacer layer 306 is made of non-doped GaAs.

The upper DBR 307 includes 26 pairs of refractive index layers each including a lower refractive index layer made of p-$Al_{0.9}Ga_{0.1}As$ and a higher refractive index layer made of p-GaAs. That is, the lower refractive index layers and the higher refractive index layers are alternatingly layered to form the upper DBR 307. It is noted that a composition gradient layer (not shown) with a thickness of 20 nm in which the layer composition gradually changes from one layer composition to the other layer composition is provided between the lower refractive index layer and the higher refractive index layer in order to reduce electrical resistance. The thermal resistance of $Al_{0.9}Ga_{0.1}As$ is 3.9 cm K/W, which is higher than the thermal resistance of GaAs (2.3 cm K/W). Accordingly, in the upper DBR 307, the thermal resistance of the lower refractive layer is higher than the thermal resistance of the higher refractive index layer. In other words, in the third embodiment of the present invention, the lower refractive index layer has the higher thermal resistance, and the higher refractive index layer has the lower thermal resistance.

It is noted that a selectively oxidized layer 308 made of p-AlAs is arranged at the mid-section of the upper DBR 307.

Also, a concave portion is created at the rear face of the substrate 301 by etching the substrate 301 toward the buffer layer 302, and oscillation light may be output via this concave portion. Further, the concave portion surface (light emitting face) is covered by an anti-reflection film (AR coating) 313 in order to prevent light from being reflected by the concave portion surface to affect laser operations.

Figure 14:
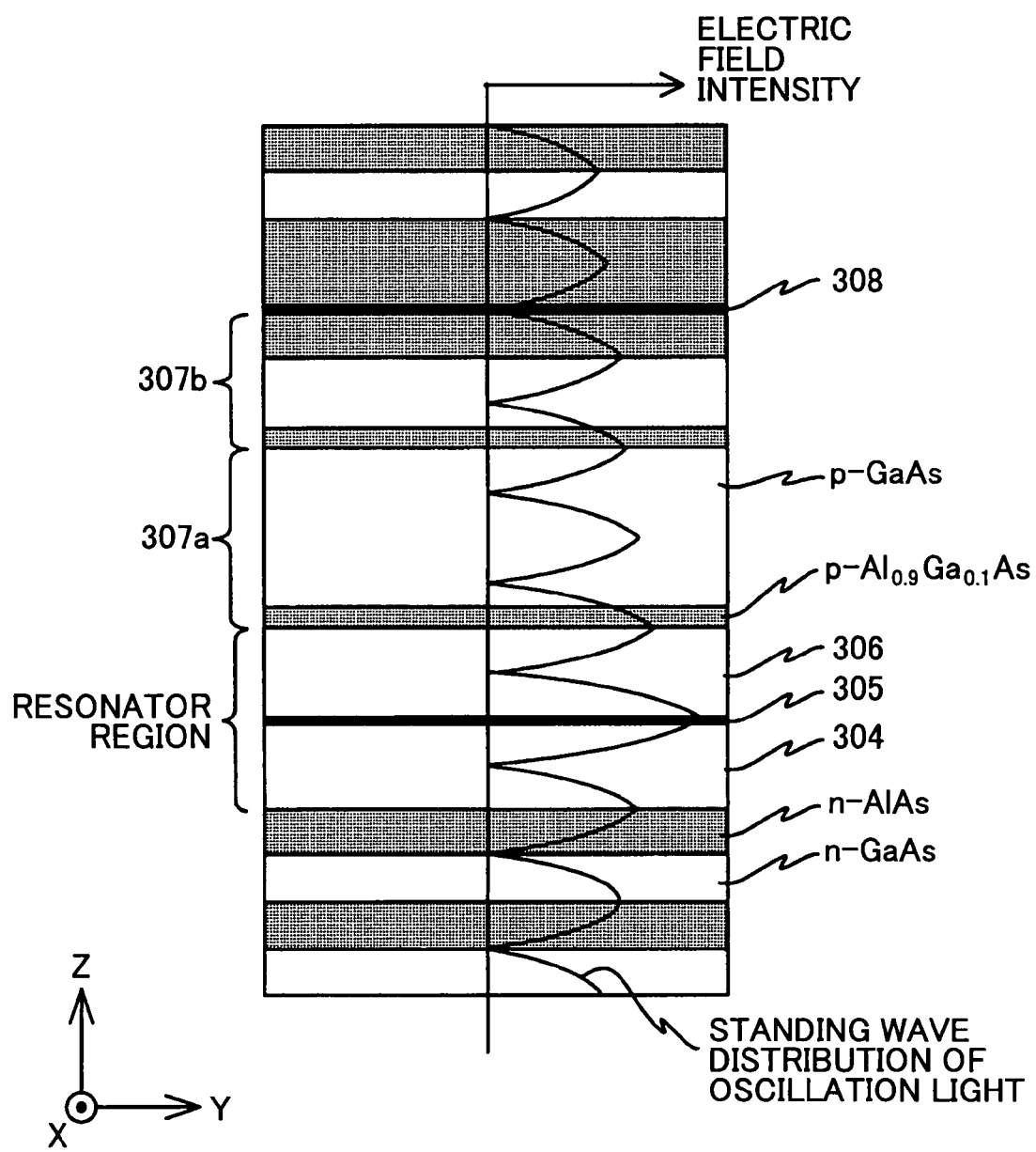
FIG. 14 is a diagram showing a layer configuration near a resonator region of the surface emitting laser element of FIG. 13.

As is shown in FIG. 14, according to the third embodiment of the present invention, a pair of refractive index layers 307a of the upper DBR 307 that is closest to the resonator region is arranged such that its higher refractive index layer has a thickness at which an oscillation light phase change of $7\pi/4$ may be achieved within the corresponding higher refractive index layer (optical thickness of $7\lambda/8$) and its lower refractive index layer has a thickness at which an oscillation light phase change of $\pi/4$ may be achieved within the corresponding lower refractive index layer (optical thickness of $\lambda/8$). It is noted that FIG. 14 illustrates the layer configuration of the third multilayer structure together with the standing wave distribution of the oscillation light in the oscillating state.

Also, a pair of refractive index layers 307b that is arranged next to the pair of refractive layers 307a of the upper DBR 307 is arranged such that its higher refractive index layer has a thickness at which an oscillation light phase change of $3\pi/4$ may be achieved within the corresponding higher refractive index layer (optical thickness of $3\lambda/8$) and its lower refractive index layer has a thickness at which an oscillation light phase change of $\pi/4$ may be achieved within the corresponding lower refractive index layer (optical thickness of $\lambda/8$).

As can be appreciated from the above descriptions, according to the third embodiment of the present invention, in the two pairs of refractive index layers 307a and 307b of the upper DBR 307 that are arranged close to the resonator region, the refractive index layer with the lower thermal resistance is arranged to have an optical thickness greater than $\frac{1}{4}$ of the oscillation wavelength, and the refractive index layer with the higher thermal resistance is arranged to have an optical thickness less than $\frac{1}{4}$ of the oscillation wavelength.

Also, in the pair of refractive layers 307a that is closest to the resonator region, the sum of the optical thickness of the refractive layer with the lower thermal resistance and the optical thickness with the higher thermal resistance is arranged to be $\frac{4}{4}$ of the oscillation wavelength (m=4).

In the pair of refractive index layers 307b that is next to the pair of refractive index layers 307a, the sum of the optical thickness of the refractive layer with the lower thermal resistance and the optical thickness with the higher thermal resistance is arranged to be $\frac{2}{4}$ of the oscillation wavelength (m=2).

In FIG. 13, a $SiO_2$ layer 309, a p-side electrode 311, and an n-side electrode 312 of the surface emitting laser element 300 are shown.

According to the third embodiment of the present invention, the heat sink is attached to the p-side electrode 311 via conductive resin.

As can be appreciated from the above-descriptions, in the surface emitting laser element 300 according to the third embodiment of the present invention, the optical thickness of the lower refractive index layer with the higher thermal resistance is arranged to be less than that according to the prior art in the two pairs of refractive index layers 307a and 307b of the upper DBR 307 that are close to the resonator region. In this way, the rate at which heat is diffused in horizontal directions (parallel directions with respect to the substrate 301) via the higher refractive index layer may be increased compared to the prior art.

Also, in the surface emitting laser element 300 according to the third embodiment of the present invention, the pair of refractive index layers 307a of the upper DBR 307 that is closest to the resonator region is arranged such that the sum of the optical thickness of its lower refractive index layer and the optical thickness of its higher refractive index layer is equal to $\lambda$. The pair of refractive index layers 307b next to the pair of refractive index layers 307a is arranged such that the sum of the optical thickness of its lower refractive index layer and the optical thickness of its higher refractive index layer is equal to $\lambda/2$. In this way, the oscillation wavelength may be prevented from changing, and a high reflectance may be maintained.

Also, in the surface emitting laser element 300 according to the third embodiment of the present invention, $Al_{0.9}Ga_{0.1}As$ having a low oxidization speed is used as the material of the upper DBR 307 so that it may be prevented from being oxidized in the selective oxidization process.

Also, in the surface emitting laser element 300 according to the third embodiment of the present invention, AlAs and GaAs that have lower thermal resistances are used as the materials of the lower DBR 303 so that the overall thermal resistance of the lower DBR 303 may be reduced.

In this way, heat diffusion characteristics of the surface emitting laser element according to the third embodiment of the present invention may be improved compared to that of the prior art. As a result, heat generated at the active layer 305 may be effectively removed to reduce temperature increase in the active layer 305 and secure higher optical power compared to the prior art.

It is noted that in the above-described third embodiment of the present invention, the refractive index layer with the lower thermal resistance is arranged to have an optical thickness greater than $\frac{1}{4}$ of the oscillation wavelength, and the refractive index layer with the higher thermal resistance is arranged to have an optical thickness less than $\frac{1}{4}$ of the oscillation wavelength in the two pairs of refractive index layers 307a and 307b of the upper DBR 307 that are close to the resonator region. However, the present invention is not limited to such an embodiment, and in another embodiment, the refractive index layer with the lower thermal resistance is arranged to have an optical thickness greater than ¼ of the oscillation wavelength, and the refractive index layer with the higher thermal resistance is arranged to have an optical thickness less than ¼ of the oscillation wavelength in three pairs of refractive index layers of the upper DBR that are close to the resonator region, for example.

Fourth Embodiment

Figure 15:
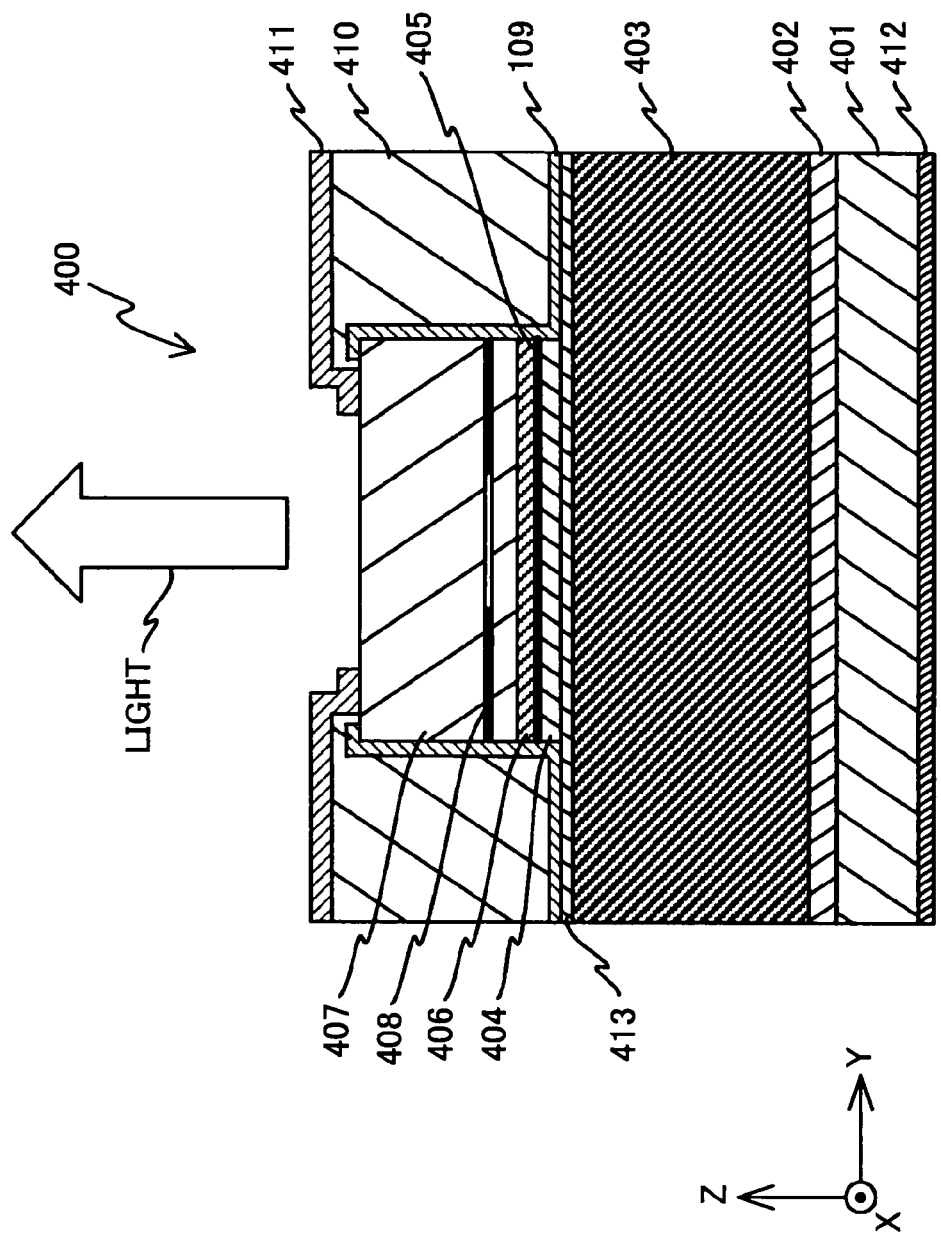
FIG. 15 is a diagram showing a configuration of a surface emitting laser element according to a fourth embodiment of the present invention.

A fourth embodiment of the present invention is described below with reference to FIGS. 15 and 16. FIG. 15 is a diagram showing a configuration of a vertical cavity surface emitting laser element 400 according to the fourth embodiment of the present invention.

The illustrated surface emitting laser element 400 is a 780-nm-band surface emitting laser element that has a substrate 401 and semiconductor layers including a buffer layer 402, a lower DBR 403, an etching stop layer 413, a lower spacer layer 404, a multi-quantum well active layer 405, an upper spacer layer 406, and an upper DBR 407, for example, that are successively layered on the substrate 401 in this order. It is noted that in the following descriptions, the above multilayer structure of the semiconductor layers is referred to as 'fourth multilayer structure' hereinafter.

In the present example, the substrate 401 is made of n-GaAs.

The buffer layer 402 is made of n-GaAs.

The lower DBR 403 includes 40.5 pairs of refractive index layers each including a lower refractive index layer made of n-AlAs and a higher refractive index layer made of n-$Al_{0.3}Ga_{0.7}As$. In other words, the lower refractive layers and the higher refractive layers are alternatingly layered to form the lower DBR 303. It is noted that the thermal resistance of AlAs is lower than the thermal resistance of $Al_{0.3}Ga_{0.7}As$. Therefore, the thermal resistance of the lower refractive layer of the lower DBR 403 is lower than the thermal resistance of the higher refractive layer. That is, in the fourth embodiment of the present invention, the lower refractive layer of the lower DBR 403 has the lower thermal resistance and the higher refractive layer has the higher thermal resistance.

The etching stop layer 413 has a thickness of 20 nm and is made of GaInP.

The lower spacer layer 404 is made of non-doped $Al_{0.6}Ga_{0.4}As$.

The multi-quantum well active layer 405 is made of $Al_{0.15}Ga_{0.85}As/Al_{0.6}Ga_{0.4}As$.

The upper spacer layer 406 is made of non-doped $Al_{0.6}Ga_{0.4}As$.

The upper DBR 407 includes 26 pairs of refractive index layers each including a lower refractive index layer made of p-$Al_{0.9}Ga_{0.1}As$ and a higher refractive index layer made of p-$Al_{0.3}Ga_{0.7}As$. That is, the lower refractive index layers and the higher refractive index layers are alternatingly layered to form the upper DBR 407. It is noted that a composition gradient layer (not shown) with a thickness of 20 nm in which the layer composition gradually changes from one layer composition to the other layer composition is provided between the lower refractive index layer and the higher refractive index layer in order to reduce electrical resistance. The combined thickness of the lower refractive index layer and a portion of the composition gradient layer and the combined thickness of the higher refractive index layer and the remaining portion of the composition gradient layer are arranged to satisfy their corresponding Bragg reflectance conditions.

It is noted that a selectively oxidized layer 408 made of p-AlAs is arranged at the mid-section of the upper DBR 407.

Also, a contact layer (not shown) made of GaAs is arranged on the uppermost face of the fourth multilayer structure.

Figure 16:
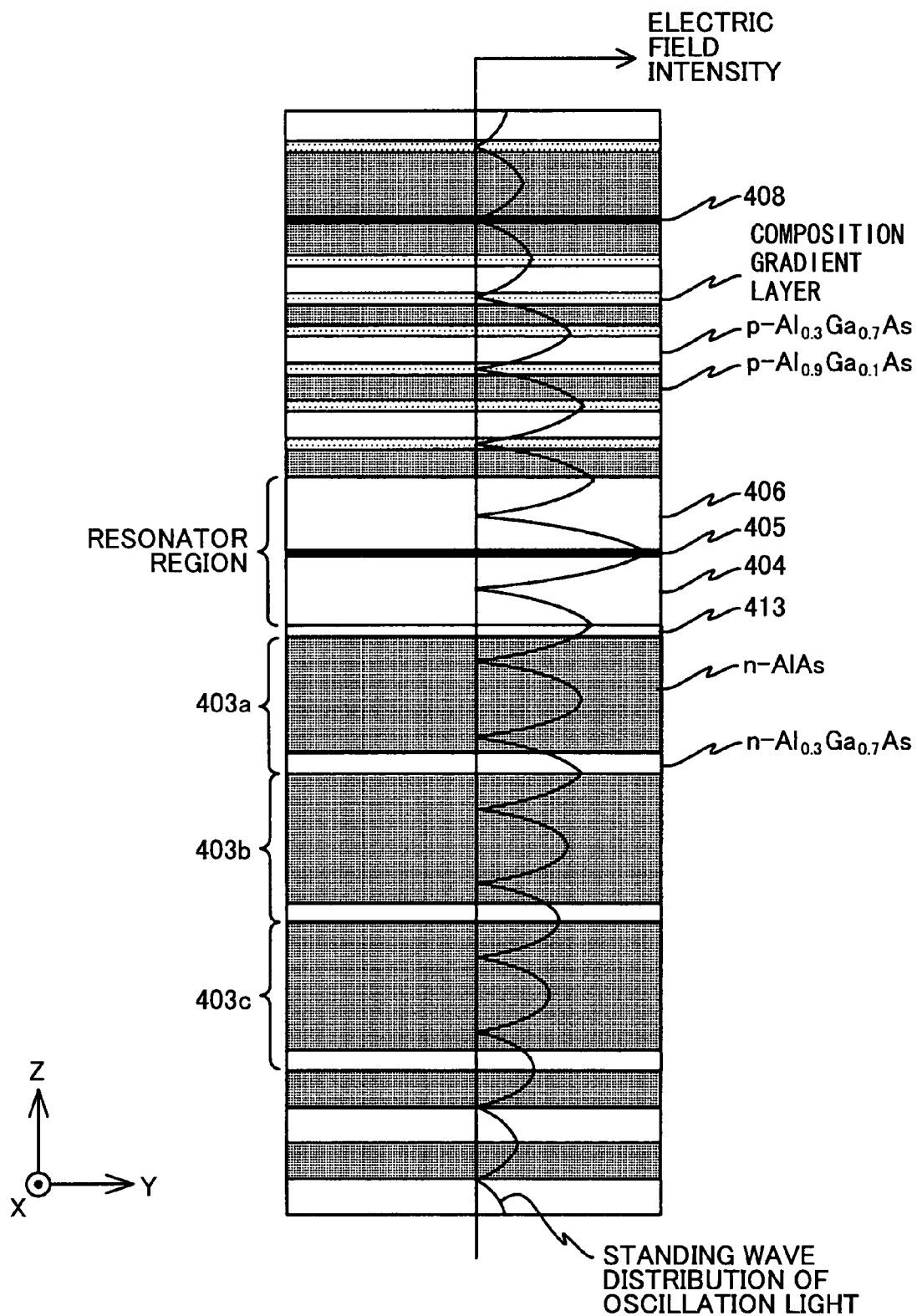
FIG. 16 is a diagram showing a layer configuration near a resonator region of the surface emitting laser element of FIG. 15.

As is shown in FIG. 16, according to the fourth embodiment of the present invention, in each of three pairs of refractive index layers 403a-403c of the lower DBR 403 that are adjacent to the resonator region, the lower refractive index layer is arranged to have a thickness at which an oscillation light phase change of $13\pi/8$ may be achieved within the corresponding lower refractive index layer (optical thickness of $13\lambda/16$), and the higher refractive index layer is arranged to have a thickness at which an oscillation light phase change of $3\pi/8$ may be achieved within the corresponding higher refractive index layer (optical thickness of $3\lambda/16$). It is noted that in FIG. 16, the standing wave distribution of the oscillation light in the oscillating state is shown along with the layer configuration of the fourth multilayer structure.

As can be appreciated from the above descriptions, in the three pairs of refractive index layers 403a-403c of the lower DBR 403 that are adjacent to the resonator region, the optical thickness of the refractive index layer with the lower thermal resistance is arranged to be greater than ¼ of the oscillation wavelength, and the optical thickness of the refractive index layer with the higher thermal resistance is arranged to be less than ¼ of the oscillation wavelength. Also, the sum of the optical thickness of the refractive index with the lower thermal resistance and the optical thickness of the refractive index with the higher thermal resistance is arranged to be 4/4 of the oscillation wavelength (m=4).

In the fourth embodiment of the present invention, selective etching may be performed using a sulfuric acid solution or a phosphoric solution. Specifically, first, dry etching that has superior processing accuracy may be used to etch layers coming before the etching stop layer 413 and accurately create a column structure close to a mesa structure. Then, wet etching that enables selective etching according to the material being etched may be used to reach the etching stop layer 413 and create a mesa structure with the etching stop layer 413 as the bottom face. In this case, the etching depth does not have to be precisely controlled since the etching process may be automatically terminated upon reaching the upper face of the etching stop layer 413.

According to the present embodiment, the layers positioned on the upper side of the etching stop layer 413 are completely etched, and a mesa structure with accurate dimensions may be created. Also, by providing the etching stop layer 413, the layers arranged below this etching stop layer 413 may be prevented from being etched.

As can be appreciated from the above descriptions, in the surface emitting laser element 400 according to the fourth embodiment of the present invention, each of the three pairs of refractive index layers 403a-403c is arranged such that the higher refractive index layer with the higher thermal resistance has an optical thickness that is less than the corresponding optical thickness used in the prior art. In this way, the overall thermal resistance of the lower DBR 403 in the direction from the active layer 405 toward the substrate 401 may be reduced compared to the prior art.

Also, in the surface emitting laser element 400 according to the fourth embodiment of the present invention, each of the three pairs of refractive index layers 403a-403c is arranged such that the lower refractive index layer with the lower thermal resistance has an optical thickness that is greater than the corresponding optical thickness used in the prior art. In this way, the rate of heat diffusion in the horizontal directions (parallel directions with respect to the substrate 401) may be increased while heat from the active layer 405 is transmitted to the lower refractive layer.

Also, in the surface emitting laser element 400 according to the fourth embodiment of the present invention, the sum of the optical thickness of the lower refractive index layer and the optical thickness of the higher refractive index layer is arranged to equal λ in each of the three pairs of refractive index layers 403a-403c so that the reflectance wavelength may be prevented from changing and a high reflectance may be maintained.

Also, in the surface emitting laser element 400 according to the fourth embodiment of the present invention, a lower refractive index layer with a lower thermal resistance and a greater optical thickness than the prior art is arranged in the vicinity of the resonator region so that heat generated at the active layer 405 may be efficiently diffused in the horizontal directions (parallel directions with respect to the substrate 401).

Also, since the surface emitting laser element 400 according to the fourth embodiment has the etching stop layer 413, the lower DBR 403 may be prevented from being exposed at the mesa structure side face and oxidized in the selective oxidization process. Accordingly, AlAs that has very low thermal resistance characteristics may be used as the material of the lower DBR 403.

As can be appreciated from the above descriptions, heat diffusion characteristics may be improved in the surface emitting laser element 400 according to the fourth embodiment compared to the prior art. As a result, heat generated at the active layer 405 may be effectively removed and temperature increase in the active layer may be reduced so that higher optical power may be secured in the surface emitting laser element 400 according to the fourth embodiment.

It is noted that in the above-described fourth embodiment of the present invention, the optical thickness of the refractive index layer with the lower thermal resistance is arranged to be greater than ¼ of the oscillation wavelength, and the optical thickness of the refractive index layer with the higher thermal resistance is arranged to be less than ¼ of the oscillation wavelength in three pairs of refractive index layers 403a-403c of the lower DBR 403 that are adjacent to the resonator region. However, the present invention is not limited to such an embodiment, and for example, the optical thickness of the refractive index layer with the lower thermal resistance is arranged to be greater than ¼ of the oscillation wavelength, and the optical thickness of the refractive index layer with the higher thermal resistance is arranged to be less than ¼ of the oscillation wavelength in one pair of refractive index layers of the lower DBR 403 that is adjacent to the resonator region. In another example, the optical thickness of the refractive index layer with the lower thermal resistance is arranged to be greater than ¼ of the oscillation wavelength, and the optical thickness of the refractive index layer with the higher thermal resistance is arranged to be less than ¼ of the oscillation wavelength in five pairs of refractive index layers of the lower DBR 403 that are adjacent to the resonator region.

Also, it is noted that in the above-described fourth embodiment of the present invention, the MOCVD method is used for inducing crystal growth; however, the present invention is not limited to such an embodiment and for example, the molecular beam epitaxy (MBE) method or some other crystal growth technique may be used as well.

(Surface Emitting Laser Array)

Figure 17:
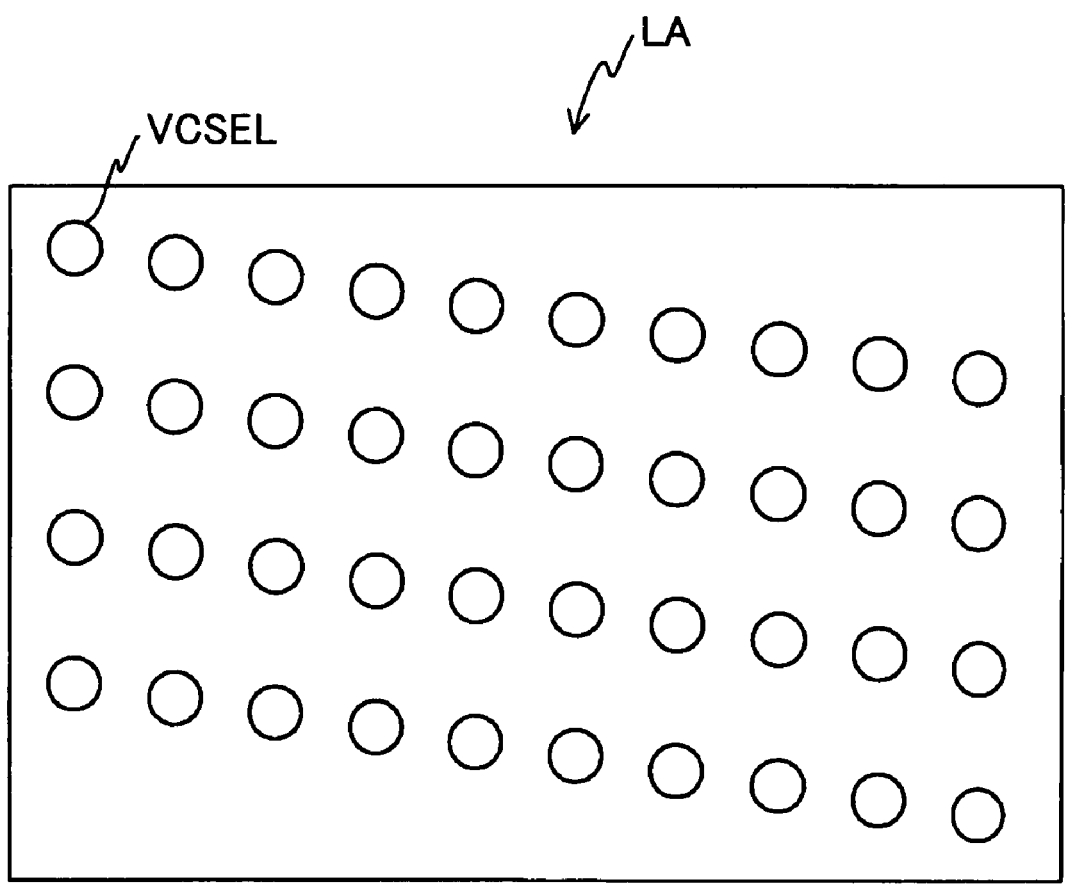
FIG. 17 is a diagram showing a configuration of a surface emitting laser array according to an embodiment of the present invention.

FIG. 17 is a diagram showing a configuration of a surface emitting laser array according to an embodiment of the present invention. The illustrated surface emitting laser array LA has plural surface emitting laser elements (e.g., 4×10=40 laser elements in the illustrated example) integrally arranged on a single substrate. It is noted that any one of the above-described surface emitting laser elements 100-400 may be used as the surface emitting laser elements of the surface emitting laser array LA. Since the surface emitting laser elements 100-400 have improved heat diffusion characteristics compared to surface emitting laser elements according to the prior art, heat interference between the surface laser elements may be reduced when the plural surface laser elements are simultaneously operated in the surface emitting laser array LA. Thus, according to the present embodiment, surface emitting laser elements with high optical power may be arranged at a higher density. Also, in the surface emitting laser array LA according to the present embodiment, temperature differences between surface emitting laser elements may be reduced when the plural surface emitting laser elements are operated at the same time so that the surface emitting laser elements of the surface emitting laser array LA may have substantially uniform optical power characteristics.

By installing the surface emitting laser array LA according to the present embodiment in an apparatus, temperature increase in the apparatus may be reduced compared to the case of installing a surface emitting laser array according to the prior art.

It is noted that although the surface emitting laser array LA according to an embodiment of the present invention is illustrated as a two-dimensional laser array in FIG. 16, the surface emitting laser array LA is not limited to such a configuration and may also be a one-dimensional laser array according to another embodiment.

(Laser Printer)

Figure 18:
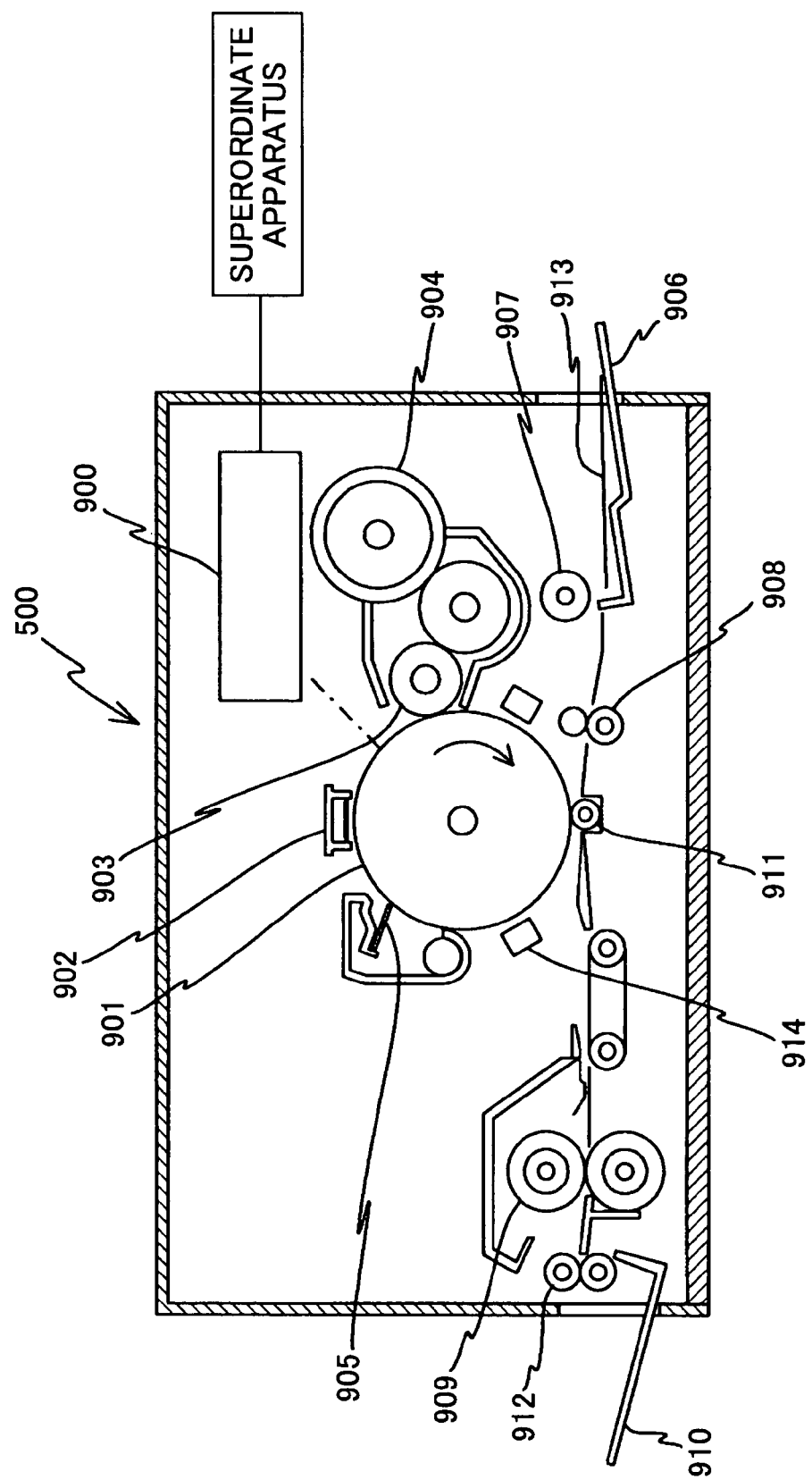
FIG. 18 is a diagram showing a configuration of a laser printer according to an embodiment of the present invention.

FIG. 18 is a diagram showing a configuration of a laser printer 500 as an image forming apparatus according to an embodiment of the present invention.

The illustrated laser printer 500 includes an optical scanning unit 900, a photoconductor drum 901, an electric charger 902, a developing roller 903, a toner cartridge 904, a cleaning blade 905, a paper feed tray 906, a paper feed roller, a pair of resist rollers 908, a transfer charger 911, a neutralizing unit 914, fixing rollers 909, paper delivery rollers 912, and a paper delivery tray 910.

The electric charger 902, the developing roller 903, the transfer charger 911, the neutralizing unit 914, and the cleaning blade 905 are arranged close to the surface of the photoconductor drum 901. Specifically, these components are arranged in the above order along the rotating direction of the photoconductor drum 901 (i.e., electric charger 902→developing roller 903→transfer charger 911→neutralizing unit 914→cleaning blade 905).

The photoconductor drum 901 corresponds to an image carrier for carrying an image that has a photoconductive layer arranged on its surface. In the illustrated example of FIG. 18, the photoconductor drum 901 is configured to rotate in the clock wise direction (direction of arrow shown in FIG. 18).

The electric charger 902 is configured to evenly charge the surface of the photoconductor drum 901.

The optical scanning unit 900 is configured to irradiate modulated light based on image information from a superordinate apparatus (e.g., personal computer) on the surface of the photoconductor drum 901 that is charged by the electric charger 902. In this way, a latent image corresponding to the image information may be formed on the surface of the photoconductor drum 901. The latent image formed on the surface of the photoconductor drum 901 moves toward the developing roller 903 in conjunction with the rotational movement of the photoconductor drum 901. It is noted that the configuration of the optical scanning unit 900 is described below.

The toner cartridge 904 stores toner that is to be supplied to the developing roller 903.

The developing roller 903 develops an actual image (toner image) corresponding to the image information by applying toner supplied from the toner cartridge 904 onto the latent image formed on the surface of the photoconductor drum 901. Then, the toner image developed from the latent image is moved toward the transfer charger 911 in conjunction with the rotational movement of the photoconductor drum 901.

The paper feed tray 906 stores recording paper 913. The paper feed roller 907 is arranged close to the paper feed tray 906 and is configured to feed the recording paper 913 one sheet at a time toward the pair of resist rollers 908 that are arranged close the transfer roller 911. The resist rollers 908 are configured to temporarily hold the recording paper 913 fed by the paper feed roller 907 and convey the recording paper 913 toward a gap between the photoconductor drum 901 and the transfer charger 911 in conjunction with the rotation of the photoconductor drum 901.

The transfer charger 911 is applied a voltage having an opposite polarity with respect to the polarity of the voltage applied to the toner so that toner on the surface of the photoconductor drum 901 may be electrically attracted to the recording paper 913. In this way, the toner image formed on the surface of the photoconductor drum 901 may be transferred to the recording paper 913. Then, the recording paper 913 with the transferred image is conveyed to the fixing rollers 909.

Heat and pressure are applied to the recording paper 913 at the fixing rollers 909, and in this way, the image transferred onto the recording paper 913 may be fixed on the recording paper 913. Then, the recording paper 913 with the fixed image is conveyed to the paper delivery tray 910 via the paper delivery rollers 912 to be stacked on the paper delivery tray 910.

The neutralization unit 914 is configured to neutralize the surface of the photoconductor drum 901.

The cleaning blade 905 is configured to remove toner remaining on the surface of the photoconductor drum 901 (residual toner). In one embodiment, the residual toner removed by the cleaning blade 905 may be reused. After residual toner is removed from the surface of the photoconductor drum 901 by the cleaning blade 905, the photoconductor drum 901 is moved back to the position of the electric charger 902.

(Optical Scanning Unit)

Figure 19:
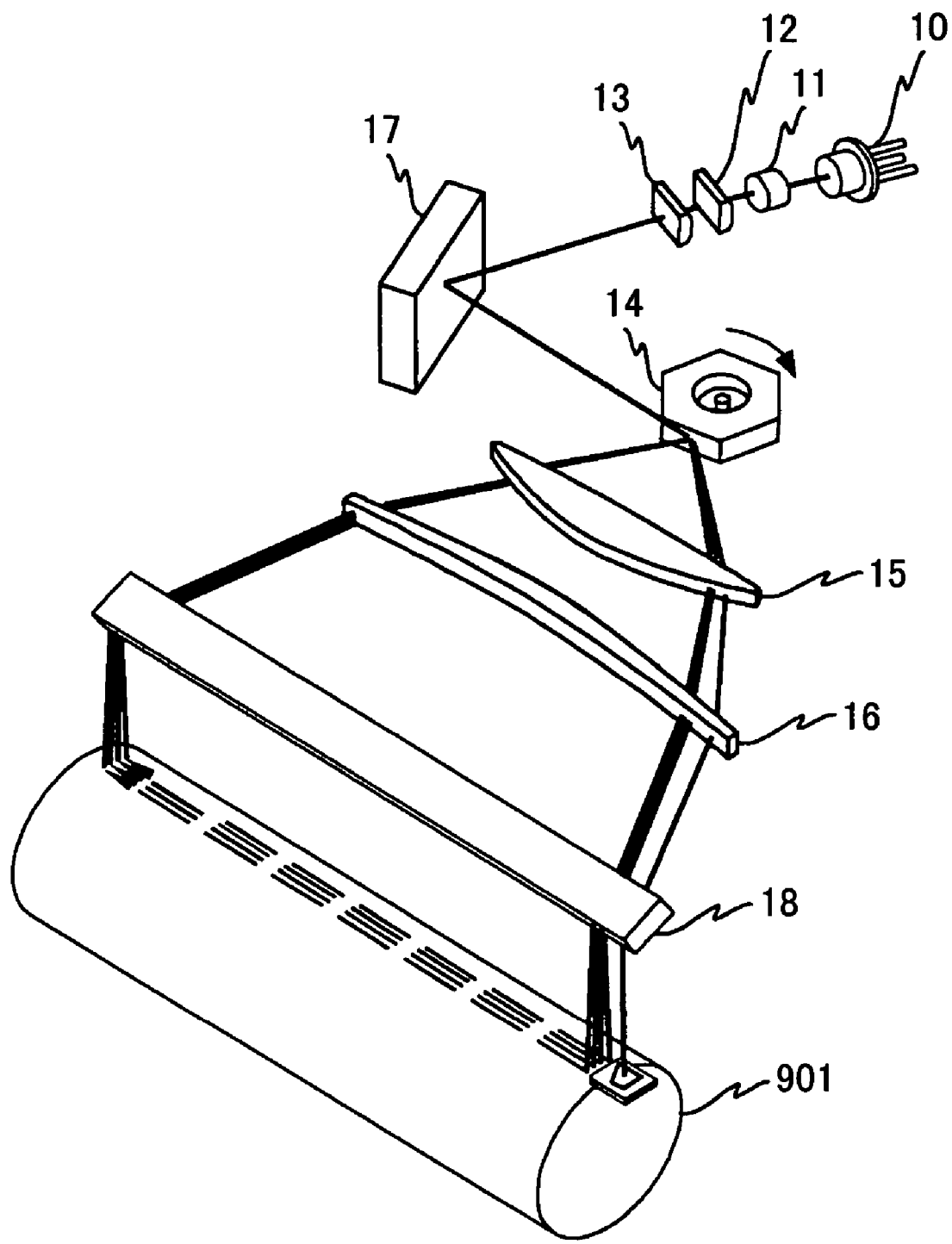
FIG. 19 is a diagram showing a configuration of an optical scanning unit of the laser printer of FIG. 18.

In the following, the structure and operations of the optical scanning unit 900 are described with reference to FIG. 19.

The optical scanning unit 900 has a light source unit 10 including the above-described surface emitting laser array LA, a coupling lens 11, an aperture 12, a cylindrical lens 13, a polygon mirror 14, a fθ lens 15, a toroidal lens 16, two mirrors 17, 18, and a main control unit (not shown) that controls overall operations of the above components.

The coupling lens 11 arranges the optical beam irradiated from the light source unit 10 to be substantially parallel.

The aperture 12 regulates the beam diameter of the optical beam passing through the coupling lens 11.

The cylindrical lens 13 condenses the optical beam passing through the aperture 12 onto the reflection surface of the polygon mirror 14 via the mirror 17.

The polygon mirror 14 has a low hexagonal prism structure with six side faces corresponding to deflection surfaces. The polygon mirror 14 is rotated in the direction of the indicated arrow of FIG. 19 at a constant angular speed by a rotating mechanism (not shown). Accordingly, an optical beam irradiated from the light source unit 10 and condensed onto the deflection surface of the polygon mirror 14 is deflected at a constant angular speed by the rotation of the polygon mirror 14.

The fθ lens 15 has an image height proportional to the angle of incidence of the optical beam deflected by the polygon mirror 14 at a constant angular speed and moves the image surface of the optical beam at a constant speed with respect to the main scanning direction.

The toroidal lens 16 receives the optical beam from the fθ lens 15 and directs the optical beam onto the surface of the photoconductor drum 901 via the mirror 18 to form an image thereon.

Figure 20:
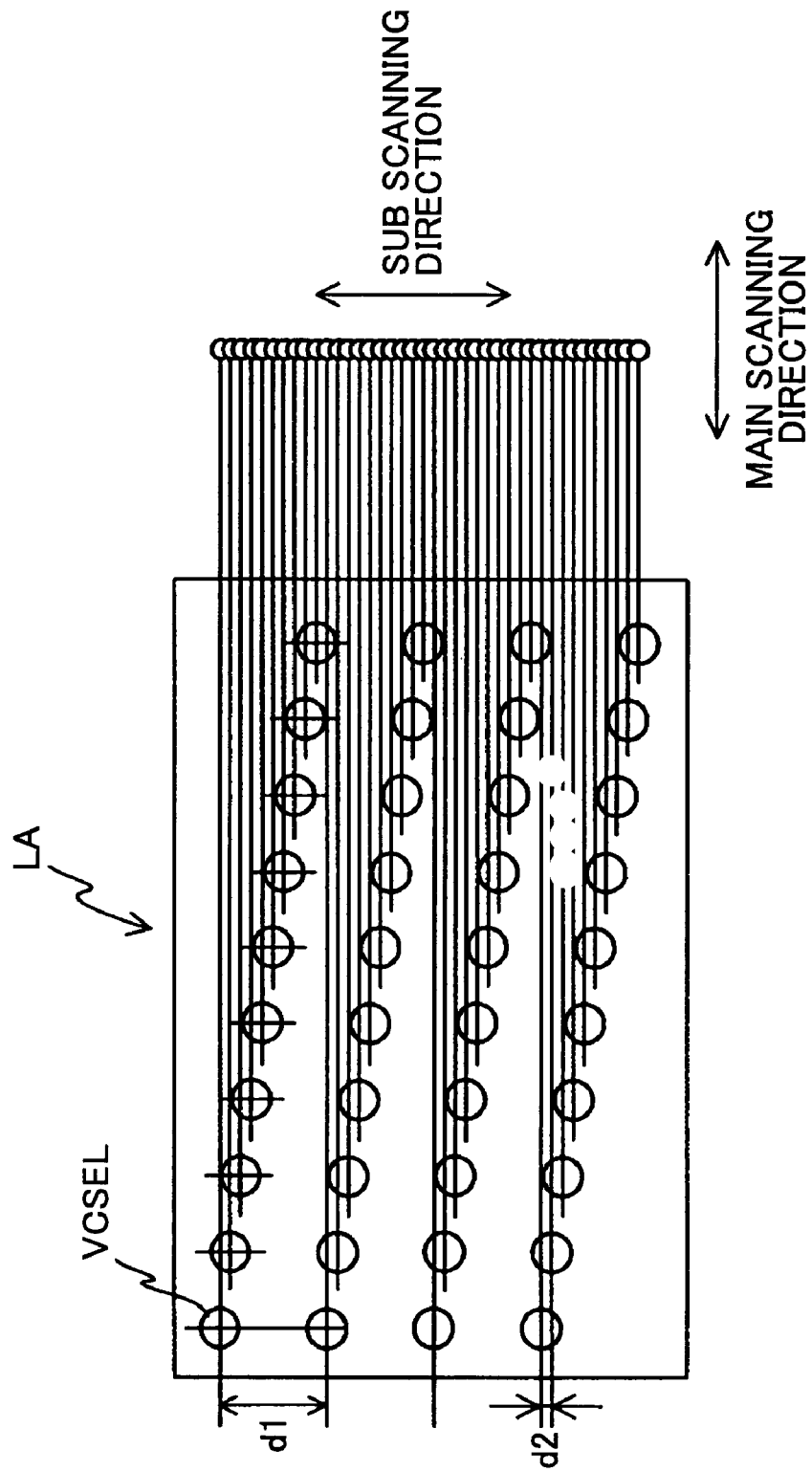
FIG. 20 is a diagram illustrating the resolution realized by the laser printer of FIG. 18 when the surface emitting laser array of FIG. 17 is used.

FIG. 20 is a diagram showing an exemplary arrangement of the surface emitting laser array LA. In the surface emitting laser array shown in FIG. 20, the surface emitting laser elements (VCSEL) are equidistantly arranged at intervals of distance d2 with respect to the sub scanning direction. Accordingly, by adjusting the lighting timings of the surface emitting laser elements, the light source may be perceived as being arranged equidistantly at the photoconductor drum 901. For example, if the pitch d1 of the surface emitting laser elements with respect to the sub scanning direction is 26.5 µm, the distance d2 between the surface emitting laser elements with respect to the sub scanning direction may be 2.65 µm. If the magnification power of the optical system is 2×, write dots may be formed at intervals of 5.3 µm with respect to the sub scanning direction on the photoconductor drum 901. It is noted that this corresponds to a resolution of 4800 dpi (dots per inch). In other words, high density writing at 4800 dpi may be enabled according to the present embodiment, for example.

In this case, the laser printer 500 may perform printing without decreasing the printing speed even when the writing dot density is increased. Also, the printing speed may be increased compared to the prior art when the writing dot density is not changed.

Since the surface emitting laser array LA uses surface emitting laser elements with improved heat diffusion characteristics compared to the prior art, it is capable of outputting high power optical beams from the surface emitting laser elements even when the pitch D1=26.5 µm and the distance D2=2.65 µm. Also, even when plural surface emitting laser elements are operated at the same time, differences in the optical power characteristics of the surface emitting laser elements may be reduced so that an accurate image may be formed at high speed in the laser printer 500 according to the present embodiment.

As can be appreciated from the above descriptions, the optical scanning unit 900 according to an embodiment of the present invention includes the light source unit 10 including the surface emitting laser array LA according to an embodiment of the present invention so that it may operate at higher optical power compared to the prior art. As a result, optical scanning may be performed on the photoconductor drum 901 at a higher speed.

Also, the laser printer 500 according to an embodiment of the present invention includes the optical scanning unit 900 including the surface emitting laser array LA according to an embodiment of the present invention so that it may be capable of forming an accurate image at high speed.

It is noted that the optical scanning unit 900 may include a surface emitting laser element that is identical or similar to any one of the above-described surface emitting laser elements 100-400 instead of the surface emitting laser array LA according to an alternative embodiment of the present invention.

Also, although an image forming apparatus according to an embodiment of the present invention is illustratively described above as the laser printer 500, embodiments of the present invention include other types of imaging apparatuses that include at least one of the surface emitting laser elements 100-400 or the surface emitting laser array LA so as to perform accurate image formation at high speed.

Also, embodiments of the present invention include a color image forming apparatus that includes an optical scanning unit adapted to scan a color image. Such a color image forming apparatus may be capable of accurately forming an image at high speed by having its optical scanning unit use any one of the surface emitting laser elements 100-400 or the surface emitting laser array LA, for example.

Also, color image forming apparatuses as embodiments of the present invention may include a tandem color printer that has plural photoconductor drums for plural colors such as a photoconductor drum for black (K), a photoconductor drum for cyan (C), a photoconductor drum for magenta (M), and a photoconductor drum for yellow (Y), for example.

(Optical Communication System)

Figure 21:
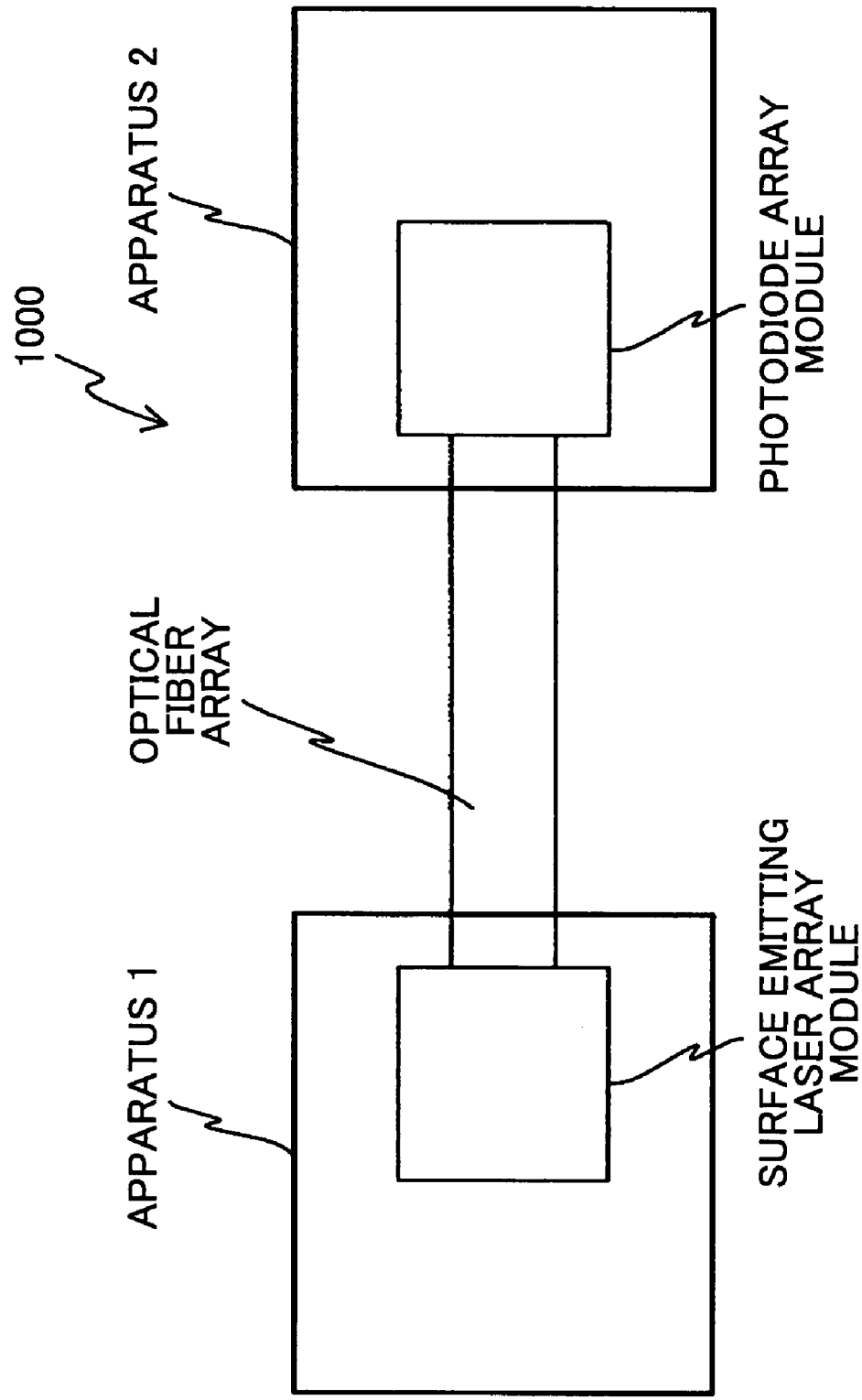
FIG. 21 is a diagram showing a configuration of an optical communication system according to an embodiment of the present invention.

FIG. 21 is a diagram showing a configuration of an optical communication system 1000 according to an embodiment of the present invention.

The illustrated optical communication system 1000 interconnects apparatus 1 (sending side apparatus) and apparatus 2 (receiving side apparatus) using an optical fiber array. The apparatus 1 as the sending side apparatus has a surface emitting laser array module including a surface emitting laser array that integrates plural surface emitting laser elements in a one-dimensional arrangement, the surface emitting laser elements having configurations substantially identical to one of the above-described surface emitting laser elements 100-400, and a drive circuit for driving the surface emitting laser array. The apparatus 2 as the receiving side apparatus has a photodiode array module including a PD array that integrates plural optical receiver elements into a one-dimensional arrangement and a signal processing circuit that amplifies and rectifies an output signal of the PD array.

Since the optical communication system 1000 according to the present embodiment uses plural surface emitting laser elements having configurations substantially identical to the surface emitting laser elements 100-400 according to embodiments of the present invention, high power optical beams having substantially uniform optical power characteristics may be irradiated from the surface emitting laser elements. Accordingly, data transmission with a low transmission error rate may be realized even when high speed transmission is performed, and in turn, reliable high speed optical communication may be enabled. Also, reliable high speed remote location communication may be enabled.

Also, since the surface emitting laser elements 100-400 has improved heat diffusion characteristics compared to the prior art, the surface emitting laser array module may not need a cooling device so that manufacturing costs may be reduced, for example.

It is noted that although the above-described optical communication system 1000 according to the present embodiment uses a surface emitting laser array, in alternative embodiments, an optical communication system may include a single surface emitting laser element having a configuration identical to any one of the surface emitting laser elements 100-400. In this way, a reliable serial transmission system with a low error rate may be realized.

Also, it is noted that an optical communication system according to an embodiment of the present invention is not limited to being used for establishing optical communication between apparatuses and may also be used for establishing optical interconnection between boards, chips, or establishing optical communication within a chip, for example. Also, an optical communication system according to an embodiment of the present invention may be used for interconnecting plural computer systems to construct a super high speed network system, for example. Since the power consumption rate of a surface emitting laser element may be significantly reduced compared to that of an edge emitting laser element, and the surface emitting laser element may be easily arranged into a two-dimensional array, it is well suited for application to an optical communication system for enabling parallel transmission.

As can be appreciated from the above descriptions, a surface emitting laser element according to an embodiment of the present invention may be adapted for improving heat diffusion characteristics compared to the prior art. A surface emitting laser array according to an embodiment of the present invention may be adapted for arranging surface emitting laser elements with high optical power at a high density. An optical scanning unit according to an embodiment of the present invention may be adapted for scanning a scanning surface at high speed. An image forming apparatus according to an embodiment of the present invention may be adapted for accurately forming an image at high speed. An optical communication system according to an embodiment of the present invention may be adapted for enabling high speed optical communication.

Although the present invention is shown and described with respect to certain preferred embodiments, it is obvious that equivalents and modifications may occur to others skilled in the art upon reading and understanding the specification. The present invention includes all such equivalents and modifications, and is limited only by the scope of the claims.

The present application is based on and claims the benefit of the earlier filing date of Japanese Patent Application No. 2006-235507 filed on Aug. 31, 2006, the entire contents of which are hereby incorporated by reference.

What is claimed is:

1. A vertical cavity surface emitting laser element comprising:
   a substrate;
   a first semiconductor multilayer reflector including a plurality of pairs of layers, the layers of each pair having differing refractive indexes and thermal resistances from each other;
   a resonator region including an active layer; and
   a second semiconductor multilayer reflector including a plurality of pairs of layers, the layers of each pair having differing refractive indexes and thermal resistances from each other; wherein
   at least one pair of layers of at least one of the first semiconductor multilayer reflector and the second semiconductor multilayer reflector includes a first layer with a lower thermal resistance that has an optical thickness greater than one fourth (¼) of an oscillation wavelength and a second layer with a higher thermal resistance that has an optical thickness less than one fourth (¼) of the oscillation wavelength; and
   a sum of the optical thickness of the first layer and the optical thickness of the second layer is equal to m/4 times the oscillation wavelength where m denotes an even number greater than or equal to two (2), wherein the resonator region includes a plurality of spacer layers, and at least one of the plurality of spacer layers contains indium and the at least one of the plurality of spacer layers has a portion thereof removed down to a mid level in a depth direction of the at least one of the plurality of spacer layers.

2. The vertical cavity surface emitting laser element as claimed in claim 1, wherein the first semiconductor multilayer reflector and the second semiconductor multilayer reflector are made of a AlGaAs material; and the first layer is made of AlAs.

3. The vertical cavity surface emitting laser element as claimed in claim 1, wherein the first semiconductor multilayer reflector and the second semiconductor multilayer reflector are made of a Al GaAs material;

the oscillation wavelength is at least 950 nm; and the first layer is made of GaAs.

4. A surface emitting laser array comprising:

a plurality of vertical cavity surface emitting laser elements each of which vertical cavity surface emitting laser elements includes a substrate;

a first semiconductor multilayer reflector including a plurality of pairs of layers, the layers of each pair having differing refractive indexes and thermal resistances from each other;

a resonator region including an active layer; and a second semiconductor multilayer reflector including a plurality of pairs of layers, the layers of each pair having differing refractive indexes and thermal resistances from each other; wherein at least one pair of layers of at least one of the first semiconductor multilayer reflector and the second semiconductor multilayer reflector includes a first layer with a lower thermal resistance that has an optical thickness greater than one fourth (¼) of an oscillation wavelength and a second Layer with a higher thermal resistance that has an optical thickness less than one fourth (¼) of the oscillation wavelength; and a sum of the optical thickness of the first layer and the optical thickness of the second layer is equal to m/4 times the oscillation wavelength where m denotes an even number greater than or equal to two (2), wherein the resonator region includes a plurality of spacer layers, and at least one of the plurality of spacer layers contains indium and the at least one of the plurality of spacer layers has a portion thereof removed down to a mid level in a depth direction of the at least one of the plurality of spacer layers.

5. An image forming apparatus comprising:

at least one image carrier;

at least one optical scanning unit that scans an optical beam including image information on the image carrier; and a transfer unit that transfers an image formed on the image carrier onto a transfer medium;

wherein the optical scanning unit includes a light source unit that includes a surface emitting laser element;

a deflection unit that deflects the optical beam irradiated from the light source unit; and a scanning optical system that condenses the deflected optical beam on the scanning surface;

wherein the surface emitting laser element includes a substrate;

a first semiconductor multilayer reflector including a plurality of pairs of layers, the layers of each pair having differing refractive indexes and thermal resistances from each other;

a resonator region including an active layer; and a second semiconductor multilayer reflector including a plurality of pairs of layers, the layers of each pair having differing refractive indexes and thermal resistances from each other;

wherein at least one pair of layers of at least one of the first semiconductor multilayer reflector and the second semiconductor multilayer reflector includes a first layer with a lower thermal resistance that has an optical thickness greater than one fourth (¼) of an oscillation wavelength and a second layer with a higher thermal resistance that has an optical thickness less than one fourth (¼) of the oscillation wavelength; and a sum of the optical thickness of the first layer and the optical thickness of the second layer is equal to m/4 times the oscillation wavelength where m denotes an even number greater than or equal to two (2), wherein the resonator region includes a plurality of spacer layers, and at least one of the plurality of spacer layers contains indium and the at least one of the plurality of spacer layers has a portion thereof removed down to a mid level in a death direction of the at least one of the plurality of spacer layers.

6. The image forming apparatus as claimed in claim 5, wherein the light source unit includes a plurality of vertical cavity surface emitting laser elements which vertical cavity surface emitting laser elements are arranged into a surface emitting laser array.

7. The vertical cavity surface emitting laser element of claim 1, wherein at least one of the spacer layers contains $(Al_{0.1}Ga_{0.9})_{0.5}In_{0.5}P$.

8. The vertical cavity surface emitting laser element of claim 1, wherein a least a portion of the indium content of the at least one of the plurality of spacer layers has been emitted from the layer.

9. The vertical cavity surface emitting laser element of claim 8, wherein the at least a portion of the emitted indium content was emitted during an etching process.

* * * * *